US010789125B2

(12) United States Patent
Ueki et al.

(10) Patent No.: US 10,789,125 B2
(45) Date of Patent: Sep. 29, 2020

(54) MEMORY SYSTEM AND METHOD

(71) Applicant: Toshiba Memory Corporation, Tokyo (JP)

(72) Inventors: Katsuhiko Ueki, Katsushika Tokyo (JP); Sumio Kuroda, Yokohama Kanagawa (JP); Yasuyuki Ozawa, Tama Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/380,003

(22) Filed: Apr. 10, 2019

(65) Prior Publication Data

US 2019/0235952 A1    Aug. 1, 2019

Related U.S. Application Data

(63) Continuation of application No. 15/449,383, filed on Mar. 3, 2017, now Pat. No. 10,261,857.

(30) Foreign Application Priority Data

Sep. 14, 2016    (JP) .................................. 2016-179372

(51) Int. Cl.
    *G06F 11/10*    (2006.01)
    *G11C 7/10*     (2006.01)
    (Continued)

(52) U.S. Cl.
    CPC ........ *G06F 11/1048* (2013.01); *G06F 11/073* (2013.01); *G06F 11/076* (2013.01);
    (Continued)

(58) Field of Classification Search
    CPC ......... H03M 13/1102; H03M 13/1105; H03M 13/353; H03M 13/911; G11C 16/26;
    (Continued)

(56) References Cited

U.S. PATENT DOCUMENTS 7,551,478 B2    6/2009  Kanno
8,122,323 B2    2/2012  Leung et al.
(Continued)

FOREIGN PATENT DOCUMENTS

JP    2007128577 A    5/2007
JP    2013542533 A    11/2013
(Continued)

OTHER PUBLICATIONS

Japanese Office Action dated Oct. 23, 2019, mailed in counterpart Japanese Application No. 2015-179372, 12 pages (with translation).

*Primary Examiner* — Shelly A Chase
(74) *Attorney, Agent, or Firm* — Kim & Stewart LLP

(57) ABSTRACT

A memory system includes a plurality of memory cells and a controller. During a write operation to write data to the memory cells, the controller encodes first data to be written at a first code rate. During a read operation to read data from the memory cells, the controller decodes second data read from the memory cells at the first code rate. The controller changes the first code rate to a second code rate that is less than the first code rate upon determining that the number of error bits during the read operation of the second data is above a threshold number for error bits or upon determining that the number of memory cells having a threshold voltage that is in a voltage range that includes a read voltage is above a threshold number for memory cells.

18 Claims, 13 Drawing Sheets

(51) Int. Cl.
*G11C 16/10* (2006.01)
*H03M 13/35* (2006.01)
*G06F 11/07* (2006.01)
*G11C 16/26* (2006.01)
*G11C 16/34* (2006.01)
*H03M 13/11* (2006.01)
*H03M 13/00* (2006.01)

(52) U.S. Cl.
CPC ............ *G11C 7/1006* (2013.01); *G11C 16/10* (2013.01); *G11C 16/26* (2013.01); *G11C 16/3495* (2013.01); *H03M 13/1105* (2013.01); *H03M 13/353* (2013.01); *H03M 13/611* (2013.01)

(58) Field of Classification Search
CPC ... G11C 16/10; G11C 7/1006; G11C 16/3495; G06F 11/1048; G06F 11/1073; G06F 11/076
See application file for complete search history.

(56) References Cited

U.S. PATENT DOCUMENTS

| | | | |
|---|---|---|---|
| 8,856,431 | B2 | 10/2014 | Chen et al. |
| 8,966,347 | B2 | 2/2015 | Dave et al. |
| 9,685,206 | B2 | 6/2017 | Choi et al. |
| 10,445,175 | B2 * | 10/2019 | Ha .................. G06F 12/0866 |
| 2007/0174740 | A1 | 7/2007 | Kanno |
| 2008/0086677 | A1 | 4/2008 | Yang et al. |
| 2010/0241928 | A1 | 9/2010 | Kim et al. |
| 2010/0296350 | A1 | 11/2010 | Kim et al. |
| 2012/0079351 | A1 | 3/2012 | Cideciyan et al. |
| 2014/0115427 | A1 | 4/2014 | Lu |
| 2014/0136927 | A1 | 5/2014 | Li et al. |
| 2014/0164880 | A1 | 6/2014 | Chen et al. |
| 2014/0258796 | A1 | 9/2014 | Ghaly et al. |
| 2014/0301142 | A1 | 10/2014 | Stoev et al. |
| 2014/0359202 | A1 | 12/2014 | Sun et al. |
| 2015/0117107 | A1 * | 4/2015 | Sun .................. G11C 16/225 365/185.12 |
| 2015/0254134 | A1 | 9/2015 | Suzuki et al. |
| 2017/0262332 | A1 | 9/2017 | Barndt et al. |

FOREIGN PATENT DOCUMENTS

| | | |
|---|---|---|
| JP | 5364911 B2 | 12/2013 |
| JP | 2014022037 A | 2/2014 |
| JP | 2015524975 A | 8/2015 |
| JP | 2015534409 A | 11/2015 |

* cited by examiner

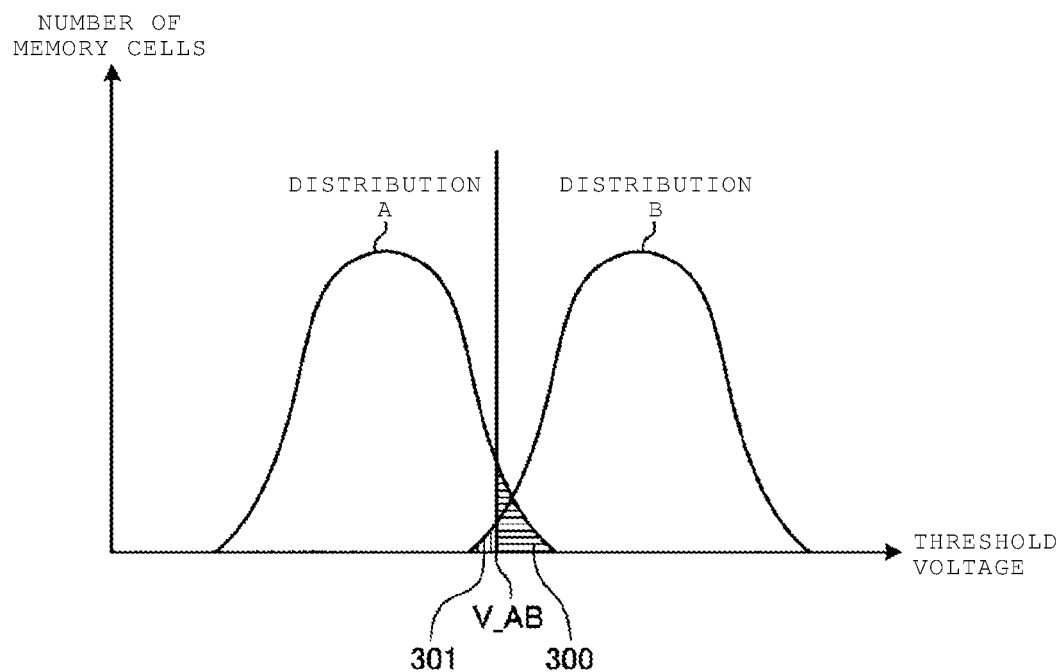

MEMORY SYSTEM AND METHOD

CROSS-REFERENCE TO RELATED APPLICATIONS

This application is a continuation of U.S. patent application Ser. No. 15/449,383, filed on Mar. 3, 2017, which is based upon and claims the benefit of priority from Japanese Patent Application No. 2016-179372, filed Sep. 14, 2016, the entire contents of each of which are incorporated herein by reference.

FIELD

Embodiments described herein relate to a memory system and a method.

BACKGROUND

In a memory system including a nonvolatile memory such as a NAND type flash memory, a programming/erasing cycle (a P/E cycle) is repeated, and thus, a memory cell of the nonvolatile memory becomes physically exhausted. Accordingly, a probability of occurrence of a read error increases. In order to cope with the read error, a writing process is widely performed by adding an error correction code to data in advance, and a restoring process is performed by error correction at the time of performing the reading.

Examples of a system employing error correction code include a code rate variable system. According to such a system, a code rate is changed, and thus, it is possible to change an error correcting capability. When the code rate variable system is applied to the memory system, the error correcting capability is strengthened as the code rate decreases. However, the capacity of storing user data decreases as the code rate decreases.

DESCRIPTION OF THE DRAWINGS

FIG. 5 is a diagram for illustrating an example of each distribution after a change.

FIG. 6 is a diagram illustrating an example voltage information according to the first embodiment.

DETAILED DESCRIPTION

Embodiments provide a memory system that is capable of efficiently controlling a code rate.

In general, according to one embodiment, a memory system includes a memory that includes a plurality of memory cells, and a controller. During a write operation to write data to the memory cells, the controller encodes first data to be written at a first code rate. During a read operation to read data from the memory cells, the controller decodes second data read from the memory cells at the first code rate. The controller changes the first code rate to a second code rate that is less than the first code rate upon determining that the number of error bits during the read operation of the second data is above a threshold number for error bits or upon determining that the number of memory cells having a threshold voltage that is in a voltage range that includes a read voltage is above a threshold number for memory cells.

Hereinafter, memory systems and methods according to embodiments will be described in detail with reference to the attached drawings. Furthermore, embodiments are not limited to those described herein.

First Embodiment

Figure 1:
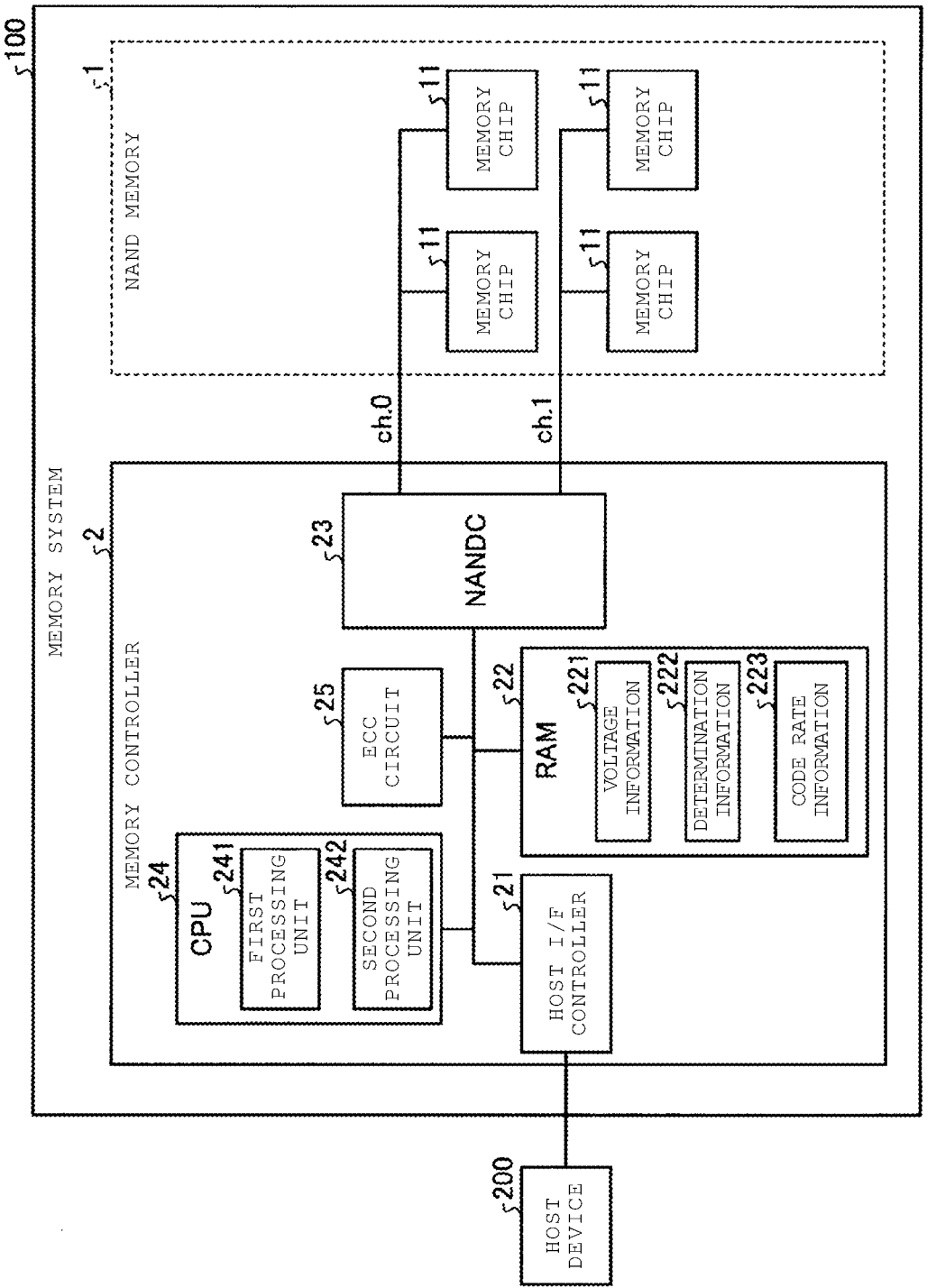
FIG. 1 is a diagram illustrating a configuration example of a memory system according to a first embodiment.

FIG. 1 is a diagram illustrating a configuration example of a memory system according to a first embodiment. A memory system 100 is connected to a host device 200. The host device 200, for example, corresponds to a server, a personal computer, a mobile type information processing device, or the like. The memory system 100 functions as an external storing device of the host device 200. The host device 200 is capable of issuing an access request (a read request and a write request) with respect to the memory system 100. Any communication interface standard may be used in the embodiments. For example, the communication interface is based on an advanced technology attachment (ATA) standard, a serial attached SCSI (SAS) standard, a peripheral components interconnect (PCI) express standard, and the like.

The memory system 100 includes a NAND type flash memory (a NAND memory) 1, a memory controller 2 between the host device 200 and the NAND memory 1, which executes data transmission. Furthermore, the memory system 100 may include other types of memory instead of the NAND memory 1. For example, the memory system 100 may include a NOR type flash memory instead of the NAND memory 1.

The NAND memory 1 includes a plurality of (here, four) memory chips 11 as a semiconductor memory. In addition, the memory controller 2 includes two channels (ch.0 and ch.1). The memory controller 2 may include one or three or more channels. Two memory chips 11 are respectively connected to each of the channels. Each of the channels includes a control signal line, an I/O signal line, a chip enable (CE) signal line, and an RY/BY signal line. The I/O signal line is a signal line for transmitting data, an address, and various instructions. The memory controller 2 is capable of transmitting a read instruction, a program instruction, and an erasing instruction to the memory chip 11 through the I/O signal line. The control signal line includes a write enable (WE) signal line, a read enable (RE) signal line, a command latch enable (CLE) signal line, an address latch enable (ALE) signal line, a write protect (WP) signal line, and the like.

Figure 2:
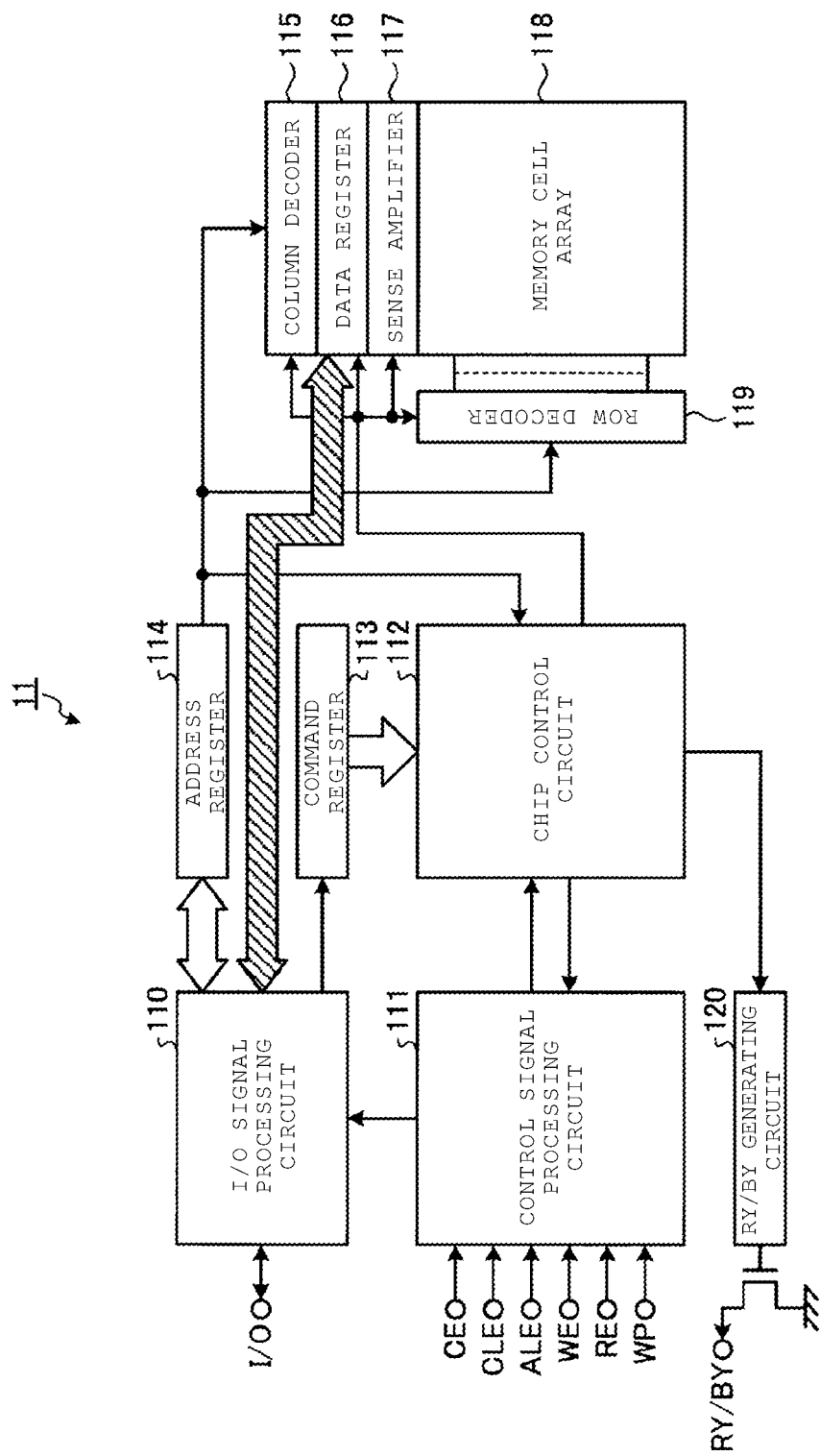
FIG. 2 is a diagram illustrating a configuration example of a memory chip according to the first embodiment.

FIG. 2 is a diagram illustrating a configuration example of each of the memory chips 11. The memory chip 11 includes an I/O signal processing circuit 110, a control signal processing circuit 111, a chip control circuit 112, a command register 113, an address register 114, a column decoder 115, a data register 116, a sense amplifier 117, a memory cell array 118, a row decoder 119, and an RY/BY generating circuit 120.

The chip control circuit 112 performs state transition based on various control signals received through the control signal processing circuit 111. The chip control circuit 112 controls all operations of the memory chip 11. The RY/BY generating circuit 120 transitions a state of the RY/BY signal line between ready state (RY) and a busy state (BY) under the control of the chip control circuit 112.

The I/O signal processing circuit 110 is a buffer circuit for transmitting and receiving an I/O signal with respect to the memory controller 2. The address and the data which designate a command and an access destination latched by the I/O signal processing circuit 110 are respectively stored in the address register 114, the command register 113, and the data register 116.

The address stored in the address register 114 includes a chip number, a row address, and a column address. The chip number is identification information for distinguishing each of the memory chips 11. The chip number is read out in the chip control circuit 112, the row address is read out in the row decoder 119, and the column address is read out in the column decoder 115, respectively.

The control signal processing circuit 111 receives an input of the control signal. The control signal processing circuit 111 executes sorting of a storage destination of the I/O signal received by the I/O signal processing circuit 110 based on the received control signal. In addition, the control signal processing circuit 111 transmits the received control signal to the chip control circuit 112.

The memory cell array 118 includes a plurality of blocks. The block is a storage area corresponding to a physical unit of erasing. That is, all of the data items stored in one block are erased in a collective manner.

Figure 3:
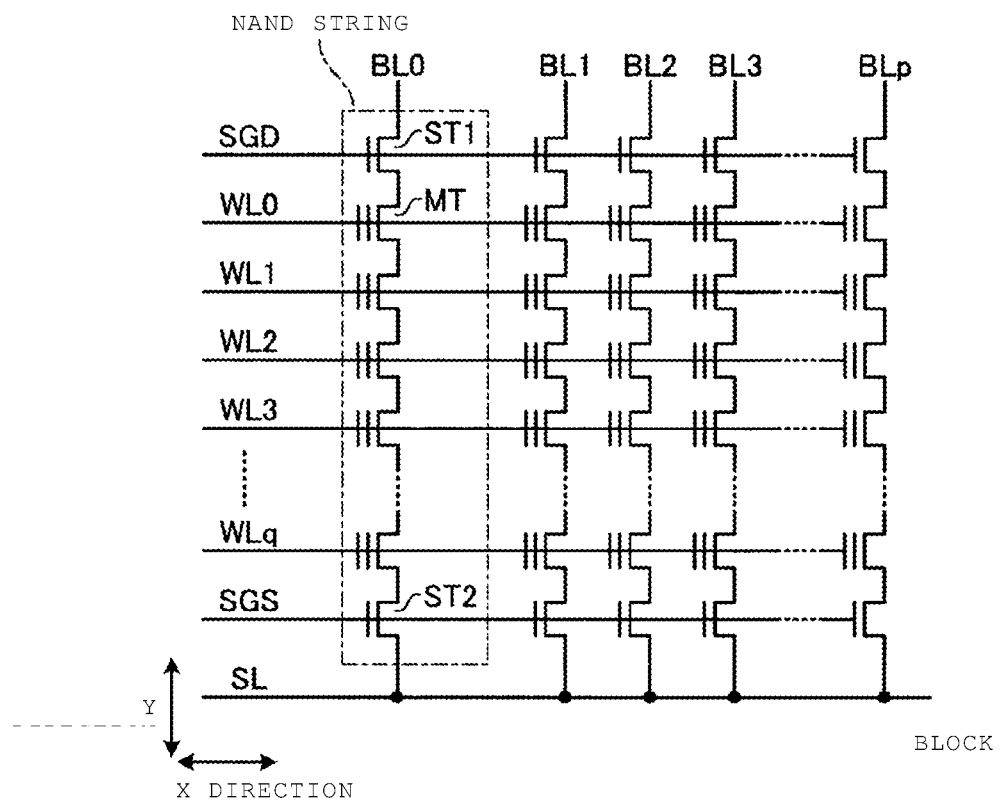
FIG. 3 is a circuit diagram illustrating a configuration example of a block according to the first embodiment.

FIG. 3 is a circuit diagram illustrating a configuration example of one block included in the memory cell array 118. As illustrated, each of the blocks includes (p+1) NAND strings which are sequentially arranged along an X direction (p≥0). In a select transistor ST1 included in each of the (p+1) NAND strings, a drain is connected to bit lines BL0 to BLp, and a gate is connected to a selection gate line SGD in common. In addition, in a select transistor ST2, a source is connected to a source line SL in common, and a gate is connected to a selection gate line SGS in common.

Each memory cell transistor MT includes a metal oxide semiconductor field effect transistor (MOSFET) having a layered gate structure formed on a semiconductor substrate. The layered gate structure includes a floating gate formed on the semiconductor substrate through a tunnel oxide film and a control gate electrode formed on the floating gate with an insulating film interposed between the gates. A threshold voltage is changed according to the number of electrons stored in the floating gate. The memory cell transistor MT stores data according to a difference in the threshold voltage.

That is, the memory cell transistor MT retains a charge in the floating gate by the amount corresponding to the data.

In each of the NAND strings, (q+1) memory cell transistors MT are arranged between a source of the select transistor ST1 and a drain of the select transistor ST2 such that current pathways thereof are serially connected to each other. The control gate electrodes of the memory cell transistors MT are respectively connected to word lines WL0 to WLq in order from the memory cell transistor MT positioned closest to the drain side. Accordingly, the drain of the memory cell transistor MT connected to the word line WL0 is connected to the source of the select transistor ST1, and the source of the memory cell transistor MT connected to the word line WLq is connected to the drain of the select transistor ST2.

The word lines WL0 to WLq connect control gate electrodes of the memory cell transistors MT in common between the NAND strings in the block. That is, the control gate electrodes of the memory cell transistors MT on the same row in the block are connected to the same word line WL. When a value of one bit is capable of being retained in each of the memory cell transistors MT, (p+1) memory cell transistors MT connected to the same word line WL are treated as one page; programming of data and reading of data are performed in units of a page.

There is a case where a value of a plurality of bits is capable of being retained in each of the memory cell transistors MT. For example, when each of the memory cell transistors MT is capable of storing a value of n (n≥2) bits, storing capacity per a word line has a size of n pages. Here, a storing system (hereinafter, a two-bit storing system) in which each of the memory cell transistors MT stores a value of two bits will be described as an example. According to the two-bit storing system, data of two pages is retained per each of the word lines. A page on which writing is performed first will be referred to as a lower page, and a page on which writing is performed after the lower page will be referred to as an upper page. In addition, the memory cell transistor MT will be simply referred to as a memory cell. Furthermore, a mode may be used in which a program is executed with respect to a plurality of pages or all pages of one word line in a collective manner.

Figure 4:
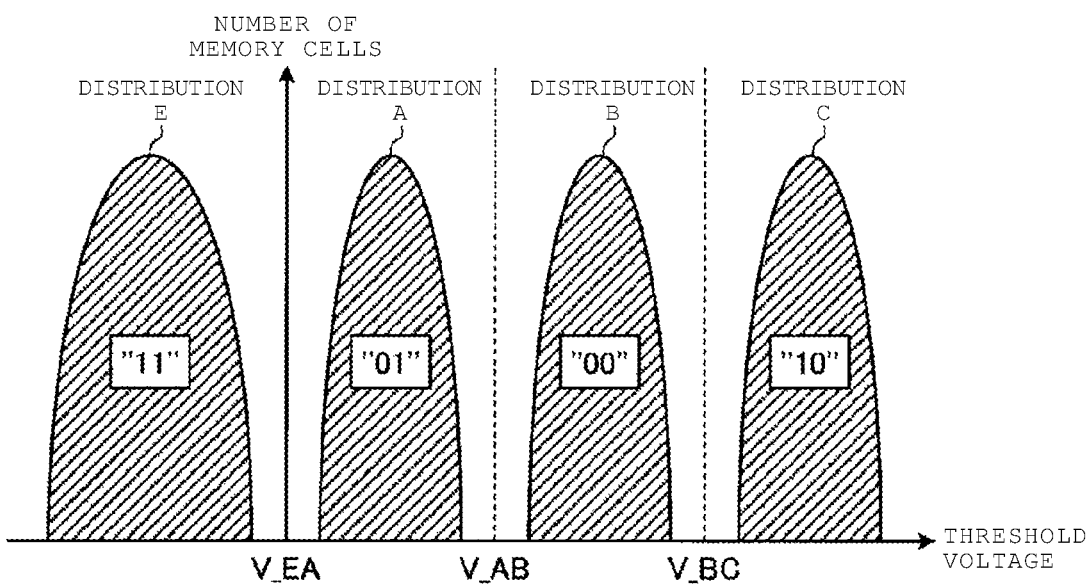
FIG. 4 is a diagram illustrating a distribution with respect to a threshold voltage of a memory cell when a two-bit storing system is adopted.

FIG. 4 is a diagram illustrating a distribution with respect to a threshold voltage of a memory cell when a two-bit storing system is adopted. In FIG. 4, a horizontal axis indicates a threshold voltage, and a vertical axis indicates the number of memory cells. According to the two-bit storing system, each memory cell is capable of retaining four-value data "xy" defined as data "x" belonging to the upper page and data "y" belonging to the lower page. The value of the data "x" and the data "y" is a code "0" or a code "1". The threshold voltages of each of the memory cells are controlled to belong to any one of four groups of a distribution E, a distribution A, a distribution B, and a distribution C. A correspondence between each of the distributions and a data value of the four-value data "xy" is set in advance. For example, a data value "11" is allocated to the distribution E. A data value "01" is allocated to the distribution A. A data value "00" is allocated to the distribution B. A data value "10" is allocated to the distribution C. Furthermore, other correspondence between each of the distributions and the data value may be set in advance. In an example, each of the data values is allocated to each of the distributions such that a Hamming distance between adjacent distributions becomes 1.

Returning to FIG. 2, the row decoder 119, the column decoder 115, the data register 116, and the sense amplifier 117 form a peripheral circuit with respect to the memory cell array 118. The peripheral circuit executes access (reading, programming, and erasing) with respect to the memory cell array 118 based on the control of the chip control circuit 112.

For example, when programming is performed, the column decoder 115 selects and activates a bit line corresponding to a column address. The sense amplifier 117 sets a potential of the bit line selected by the column decoder 115 as 0 volt. The row decoder 119 applies a programming pulse to a word line corresponding to a row address. Then, an electron is injected into a floating gate of a memory cell positioned on an intersection point between the selected bit line and the selected word line. As a result thereof, a threshold voltage of the floating gate increases. The sense amplifier 117 confirms whether or not the threshold voltage reaches a voltage according to the data stored in the data register 116 whenever the programming pulse is applied. The sense amplifier 117 continues the applying of the programming pulse to the row decoder 119 until the threshold voltage reaches the voltage according to the data.

When reading is performed, the sense amplifier 117 precharges a bit line BL to a power-supply potential Vcc, and the row decoder 119 sequentially applies a plurality of types of determination potentials (hereinafter, a read voltage) for specifying a distribution at each of the data values ("11", "01", "00", and "10") to the selected word line WL. Furthermore, the row decoder 119 applies a transmission potential to the non-selected word line WL to set a memory cell belonging to the non-selected word line WL to be in a conduction state. The sense amplifier 117 senses whether or not flow of charges accumulated by precharge to the source line SL occurs when which read voltage is applied, and thus, determines a data value stored in a target memory cell.

For example, as illustrated in FIG. 4, a read voltage V_EA is set in a range of between the distribution E and the distribution A, a read voltage V_AB is set in a range of between the distribution A and the distribution B, and a read voltage V_BC is set in a range of between the distribution B and the distribution C.

When a read target is the lower page, the read voltage V_AB is used for determination. When the flow of charges to the source line SL is sensed at the time that the read voltage V_AB is applied, the sense amplifier 117 determines that the target memory cell stores the data value "1". In addition, when the flow of charges to the source line SL is not sensed at the time that the read voltage V_AB is applied, the sense amplifier 117 determines that the target memory cell stores the data value "0".

When the read target is the upper page, the read voltage V_EA and the read voltage V_BC are used for determination. When the flow of charges is sensed at the time that the read voltage V_EA is applied or the flow of charges is not sensed even at the time that any one of the read voltage V_EA and the read voltage V_BC is applied, the sense amplifier 117 determines that the target memory cell stores the data value "1". When the flow of charges is not sensed at the time that the read voltage V_EA is applied and the flow of charges is sensed at the time that the read voltage V_BC is applied, the sense amplifier 117 determines that the target memory cell stores the data value "0".

When erasing is performed, an erase voltage is applied to a substrate of the memory cell array 118 by a voltage generating circuit (not illustrated). Then, the row decoder 119 conducts all word lines WL in a block of an erase target to a ground potential. Then, in each memory cell in the selected block, the charge accumulated in the floating gate is discharged. As a result thereof, the state of each of the memory cells in the selected block transitions to an erased state (that is, a state in which the data value "11" is stored).

The sense amplifier 117 stores the read data in the data register 116. The data stored in the data register 116 is sent to the I/O signal processing circuit 110 through a data line, and is transmitted to the memory controller 2 from the I/O signal processing circuit 110.

Furthermore, values of each of the read voltages V_EA to V_BC are stored in a nonvolatile storage unit which is arranged in the memory chip 11. For example, the memory chip 11 stores a reference value (a fixed value) of the read voltages V_EA to V_BC. A common value of a plurality of memory chips 11 may be set as the reference value of each of the read voltages V_EA to V_BC, or a different reference value may be set in each of the memory chips 11. In addition, a common value may be set in each block or in each unit different from the block, as the reference value of each of the read voltages V_EA to V_BC. Any method may be used as a setting method of the reference value. The memory controller 2 may set the reference value of each of the read voltages by transmitting a predetermined command to a target memory chip 11.

In the memory chip 11, the amount of charge retained in the floating gate is changed according to elapse of time. In addition, the amount of charge retained in the floating gate is also changed according to reading or programming of an adjacent memory cell. FIG. 5 is a diagram for illustrating an example of each of the distributions after a change. In FIG. 5, for the sake of simplicity, the distribution A and the distribution B are illustrated. According to this example, a base of the distribution A and a base of the distribution B overlap each other. A maximum value of the distribution A is greater than the read voltage V_AB, and a minimum value of the distribution B is less than the read voltage V_AB. When a memory cell which belongs to the distribution A and has a threshold voltage of greater than V_AB (that is, a memory cell included in a region 300) is read, the memory cell is recognized as belonging to the distribution B. That is, a data value programmed as "01" is read as "00". When a memory cell which belongs to the distribution B and has a threshold voltage of less than V_AB (that is, a memory cell included in a region 301) is read, the memory cell is recognized as belonging to the distribution A. That is, a data value programmed as "00" is read as "01". A data value changed from the time of programming is detected as an error bit when reading is performed in the memory controller 2. In the memory controller 2, the detected error bit is corrected by an error checking and correction (ECC) circuit 25 described below (refer to FIG. 1).

Returning to FIG. 1, the memory controller 2 is capable of reading data by changing a set value of the read voltage. There is a case where it is possible to reduce the number of error bits at the time of reading the data by changing the set value of the read voltage. Hereinafter, reading the data by changing the set value of the read voltage will be referred to as shift reading.

In one example, the memory controller 2 corrects the value of the read data changed from the time of performing programming by the ECC circuit 25, and thus, restores the data at the time of performing programming. When the error correction of the ECC circuit 25 fails, the memory controller 2 reads the data again by the shift reading. The memory controller 2 is capable of executing the error correction of the ECC circuit 25 with respect to the data obtained by the shift reading again. Any method may be used as a changing method of the set value of the read voltage at the time of performing the shift reading. For example, the shift reading is repeatedly executed until the error correction succeeds, and in each shift reading, a voltage value recorded in a voltage information 221 described below is sequentially set.

Furthermore, the failure of the error correction indicates that it is not possible to restore the data at the time of performing programming from the read data. Specifically, the failure of the error correction indicates that it is not possible to correct the error bit included in the read data. The success of the error correction indicates that all error bits included in the read data are corrected.

The memory controller 2 includes a host interface controller (a host I/F controller) 21, a random access memory (RAM) 22, a NAND controller (NANDC) 23, a central processing unit (CPU) 24, and the ECC circuit 25. The host I/F controller 21, the RAM 22, each of the NAND controllers 23, the CPU 24, and the ECC circuit 25 are connected to each other through a bus. Furthermore, the memory controller 2 may be one IC (integrated circuit) in which the host I/F controller 21, the RAM 22, each of the NAND controllers 23, the CPU 24, and the ECC circuit 25 are integrated. In addition, a part of the host I/F controller 21, the RAM 22, each of the NAND controllers 23, the CPU 24, and the ECC circuit 25 may be arranged outside of the memory controller 2.

The RAM 22 functions as a buffer for transmitting data between the host device 200 and the NAND memory 1. In addition, the RAM 22 provides a work area to the CPU 24. In addition, the RAM 22 stores various management information items. In the first embodiment, the RAM 22 stores the voltage information 221, determination information 222, and code rate information 223 as the management information. The details of such information items will be described below.

Furthermore, any type of the RAM 22 may be used. For example, it is possible to adopt a dynamic random access memory (DRAM) or a static random access memory (SRAM) as the type of the RAM 22.

The host I/F controller 21 executes the control of a communication interface between the host device 200 and the memory system 100 and the control of data transmission between the host device 200 and the RAM 22 under the control of the CPU 24.

The NAND controller 23 controls each of the channels (ch.0 and ch.1). The NAND controller 23 executes the control of data transmission between the NAND memory 1 and the RAM 22 under the control of the CPU 24.

The ECC circuit 25 performs encoding for correcting an error with respect to data of a programming target to the NAND memory 1, or executes error correction with respect to data read from the NAND memory 1.

The ECC circuit 25 performs encoding according to a code rate variable system. In the code rate variable system, it is possible to change a code rate according to a correcting capability to be required. The code rate is a ratio of the size of the data before being encoded to the size of a frame. The frame is a unit of the error correction. The correcting capability increases as the code rate decreases. The correcting capability is the number of error bits which are capable of being corrected per data of a predetermined size (for example, 1 KB). Any type other than a specific type may be used as the type of code to be adopted. For example, it is possible to adopt a BCH code or a low-density parity-check code (LDPC).

The CPU 24 functions as a first processing unit 241 and a second processing unit 242 based on firmware. The firmware, for example, is stored in the NAND memory 1 in advance in a nonvolatile manner, and is loaded on the work area in the RAM 22 at the time of activating the memory system 100. The CPU 24 executes the firmware loaded on the work area.

The first processing unit 241 executes the control of the code rate. Furthermore, here, the first processing unit 241 controls the code rate in each block, as an example. It is possible to execute the control of the code rate in units other than a block. For example, the code rate may be controlled in each of a plurality of blocks, or the code rate may be controlled in each storage area smaller than the block (for example, each page). In addition, the code rate may be controlled in group unit including a plurality of word lines in the same block. In addition, the code rate may be controlled in group unit including a plurality of lower pages or in group unit including a plurality of upper pages.

In general, the value of the data is easily changed according to exhaustion of the memory cell. On the other hand, the correcting capability increases according to a decrease in the code rate. Therefore, the code rate decreases according to the exhaustion of the memory cell. Thus, it is possible to increase the upper limit number of a P/E cycle with respect to the memory cell. However, when the code rate decreases, the capacity of storing user data decreases, and thus, an over-provisioned percentage decreases. Therefore, the first processing unit 241 sets the correcting capability according to an optimum value of the read voltage, in order not to decrease the code rate more than required.

The optimum value of the read voltage is a read voltage in which a raw bit error rate (RBER) is minimized. The RBER is a generation rate of the error bit of the data read from the NAND memory 1.

Specifically, the first processing unit 241 executes shift reading a plurality of times while changing the set value of the read voltage in order to estimate the optimum value of the read voltage. Then, the first processing unit 241 decreases the code rate according to the result of the shift reading executed a plurality of times.

Furthermore, the first processing unit 241 may estimate the optimum value with respect to a particular read voltage among read voltages V_EA to V_BC. For example, when the data used for determination of a change in the code rate is programmed on the upper page, the first processing unit 241 estimates the optimum value of each of the read voltages V_EA and V_BC. When the data used for determination of a change in the code rate is programmed on the lower page, the first processing unit 241 estimates the optimum value of the read voltage V_AB. That is, the first processing unit 241 is capable of estimating the optimum value of a part or all of the read voltages V_EA to V_BC.

In addition, the estimated value of the optimum value of the read voltage may not be entirely coincident with the real optimum value of the read voltage. In the first embodiment, a plurality of sets of voltage values of the read voltages V_EA to V_BC are prepared in advance, and the first processing unit 241 sets a voltage value included in a set having the smallest RBER from the plurality of sets to the estimated value of the optimum value of the read voltage. Hereinafter, the estimated value of the optimum value of the read voltage will be referred to as an optimum voltage value.

Each of the sets of the voltage values of the read voltages V_EA to V_BC is recorded in advance in the voltage information 221. FIG. 6 is a diagram illustrating an example of the voltage information 221. As illustrated in FIG. 6, the voltage information 221 has a data structure of a table format. The sets of the voltage values of the read voltages V_EA to V_BC are stored in each record of the voltage information 221. The first processing unit 241 selects one record from the voltage information 221, and executes the shift reading by setting each of the voltage values recorded in the selected record in the NAND memory 1 as the read voltage. The first processing unit 241 executes the shift reading with respect to each record, and allows the ECC circuit 25 to execute the error correction in each shift reading. The first processing unit 241 measures the RBER based on the error bit included in the data read in each shift reading and assumes a voltage value of which the RBER is minimized as the optimum voltage value.

Furthermore, it is possible to use an arbitrary value for selecting the optimum voltage value instead of the RBER insofar as the arbitrary value is a value correlated with the RBER. Here, the first processing unit 241 reads data of a unit size (for example, one frame) in each shift reading, and acquires the number of error bits included in the read data of the unit size. In one example, the number of corrected error bits is output from the ECC circuit 25, and the first processing unit 241 acquires the number of error bits output from the ECC circuit 25. In another example, the first processing unit 241 calculates XOR between data items before and after the correction, and counts the number of "1" included in a calculation result, and thus, acquires the number of error bits. The first processing unit 241 uses the acquired number of error bits for selecting the optimum voltage value. That is, the first processing unit 241 assumes a voltage value included in the set in which the number of error bits is minimized as the optimum voltage value.

In addition, any method may be used as a setting method of the read voltage. In an example, the first processing unit 241 notifies the set value of the read voltage to the NAND controller 23, and the NAND controller 23 transmits a read command to which the notified set value is added to the NAND memory 1. In the NAND memory 1, the peripheral circuit performs reading with respect to the memory cell array 118 by using the set value added to the read command as the read voltage, and outputs the read data to the memory controller 2. The set value of the read voltage may be designated as a value indicating a difference from the reference value, or may be designated as the voltage value.

The first processing unit 241 performs the shift reading by sequentially setting values which are candidates of the optimum voltage value in the NAND memory 1. In order to determine whether or not the code rate is to be changed, the first processing unit 241 analyzes data obtained by the shift reading using the candidates of the optimum voltage value.

In the first embodiment, the first processing unit 241 acquires the number of error bits included in the data obtained by the shift reading using the candidates of the optimum voltage value, as an example of the analysis. As described above, the number of error bits corresponds to the RBER, and thus, the first processing unit 241 may measure the RBER. The first processing unit 241 determines whether or not the code rate is changed based on a comparison result between the number of error bits and the determination threshold value. That is, the first processing unit 241 decreases the code rate when the number of error bits is greater than the determination threshold value.

In the analysis, the first processing unit 241 increases the determination threshold value as a current code rate decreases, in order to gradually decrease the code rate according to progress of the exhaustion of the NAND memory 1. Further, in order to increase the amount of decrease in the code rate as the amount of increase in the number of error bits increases, the first processing unit 241 sets a plurality of determination threshold values different from each other. The first processing unit 241 increases the amount of decrease in the code rate as the determination threshold value increases.

Figure 7:
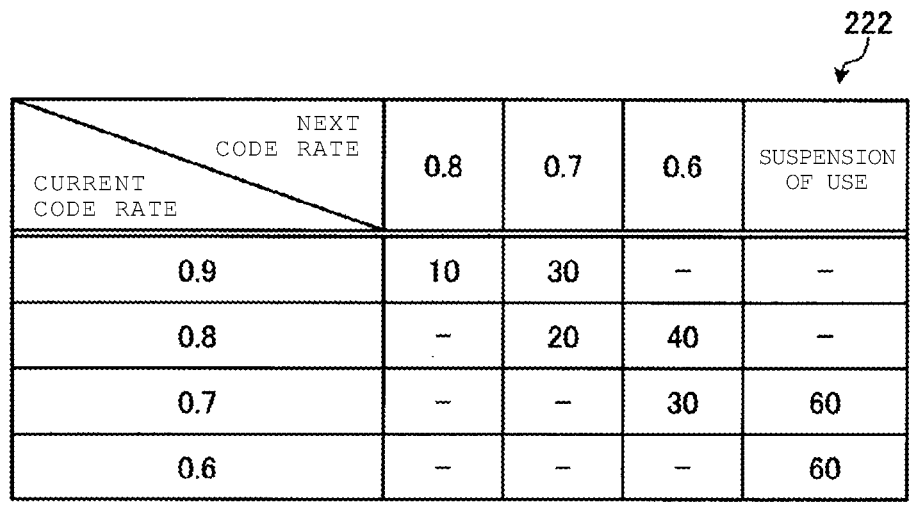
FIG. 7 is a diagram illustrating an example of determination information according to the first embodiment.

A relationship between the determination threshold value and the current code rate and a next code rate is recorded in advance in the determination information 222. FIG. 7 is a diagram illustrating an example of the determination information 222. In this example, the determination information 222 has a data structure of a table format. In this example, a row of the determination information 222 indicates the current code rate, and a column of the determination information 222 indicates the next code rate. The next code rate is a code rate which is set next by the change. The determination threshold value is recorded in the cells of the determination information 222.

For example, when the current code rate is "0.8", two determination threshold values of a determination threshold value of "20" and a determination threshold value of "40" are acquired by retrieval of the determination information 222. When the number of error bits is greater than the determination threshold value of "40" which is a larger determination threshold value in the two determination threshold values, "0.6" is acquired as the next code rate with reference to a column to which a cell recorded with the determination threshold value of "40" belongs. That is, the code rate decreases from "0.8" to "0.6". When the number of error bits is less than the determination threshold value of "40" which is the larger determination threshold value in the two determination threshold values and is greater than the determination threshold value of "20" which is a smaller determination threshold value in the two determination threshold values, "0.7" is determined as the next code rate with reference to a column to which a cell recorded with "20" belongs. That is, the code rate decreases from "0.8" to "0.7". When the number of error bits is less than the determination threshold value of "20" which is the smaller determination threshold value in the two determination threshold values, the code rate is not changed.

The determination information 222 may be configured such that three or more determination threshold values are capable of being acquired with respect to the current code rate. When the number of error bits is greater than at least a minimum determination threshold value in the three or more determination threshold values, it is determined to decrease the code rate. When the number of error bits is less than the minimum determination threshold value in the three or more determination threshold values, it is determined not to change the code rate.

The determination information 222 may be configured such that one determination threshold value is capable of being acquired with respect to the current code rate. When the number of error bits is greater than the determination threshold value, it is determined to decrease the code rate. When the number of error bits is less than the determination threshold value, it is determined not to change the code rate.

Furthermore, as illustrated in the example in FIG. 7, when the number of error bits is greater than or equal to a predetermined number in a state where the current code rate is less than or equal to a predetermined rate, the first processing unit 241 may determine suspension of use of the corresponding block. Such a block is assumed to be a bad block.

In addition, in an example, the determination threshold value (when a plurality of determination threshold values are set with respect to the current code rate, a minimum determination threshold value in the plurality of determination threshold values) is obtained by adding a margin to a correcting capability obtained by the current code rate. The margin, for example, is an amount which is increased by data retention. The margin, for example, is obtained in advance by a simulation, an experiment, or the like. Furthermore, any other method may be used as a determination method of the determination threshold value.

Figure 8:
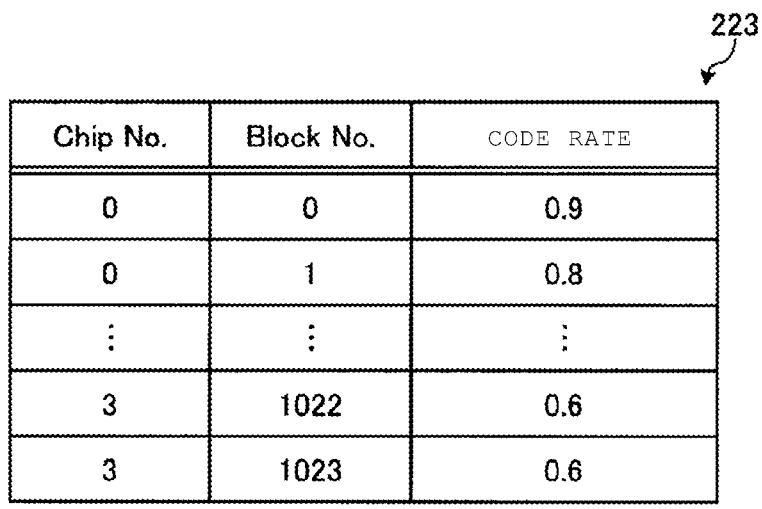
FIG. 8 is a diagram illustrating an example of code rate information.

A set value of the code rate is recorded in the code rate information 223. FIG. 8 is a diagram illustrating an example of the code rate information 223. In this example, the code rate information 223 has a data structure of a table format. In the code rate information 223, the set value of the code rate is recorded for each block. Furthermore, in the code rate information 223, the code rate may be recorded for a group unit including a plurality of word lines in the same block. In addition, the code rate may be recorded for a group unit including a plurality of lower pages or in group unit including a plurality of upper pages. Each record is specified according to a chip number and a block number. The block number, for example, includes a row address. The first processing unit 241 is capable of acquiring the current code rate in each of the blocks with reference to the code rate information 223.

The second processing unit 242 executes access with respect to the NAND memory 1. The access of the second processing unit 242 with respect to the NAND memory 1 includes access according to an access request from the host device 200, access for performing garbage collection, access for performing wear leveling, and access for performing refresh. The accesses include reading, programming, and erasing.

When data is sent to the NAND memory 1, the second processing unit 242 encodes data according to the code rate set in the code rate information 223. Specifically, the second processing unit 242 acquires a value of a code rate of a chip and a block to be accessed with reference to the code rate information 223. The second processing unit 242 notifies the acquired set value to the ECC circuit 25. The ECC circuit 25 executes encoding of the data at the notified code rate. The NAND controller 23 transmits a write command and the encoded data to the NAND memory 1.

Furthermore, the garbage collection indicates processing in which at least valid data is transmitted from one block to a vacant region of another block, and after that, all data items stored in the one block of a transmission source are assumed to be invalid data. The one block of the transmission source is assumed to be a free block after the garbage collection. None of the free blocks stores data by executing erasing, and all of the free blocks are in a state where new data is capable of being programmed.

The refresh is processing in which the data stored in the NAND memory 1 is read once, the error correction is executed with respect to the read data, and the data after the error correction is programmed again in the NAND memory 1. In the refresh, the data after the error correction is capable of being programmed in a block different from the read block.

The wear leveling is processing of smoothing the number of P/E (program/erase) cycles in each block across a plurality of blocks. The process of moving valid data between blocks is included in the wear leveling.

Furthermore, the data being valid indicates that the data is in a newest state. When a plurality of data items sent along with designation of the same logic address from the host device 200 is stored in the NAND memory 1, the newest state indicates a state of data which is finally sent from the host device 200 in the plurality of data items. When the data which is finally sent from the host device 200 is replicated by the garbage collection, a state of data which is finally generated by the replication is in the newest state. The invalid data indicates data in which data which is finally sent by the host device 200 and is finally programmed in the NAND memory 1 is excluded from the plurality of data items.

Furthermore, the code rate is capable of being changed at an arbitrary timing. In an example, when the change of the code rate is determined with respect to a certain block in use, the code rate according to the certain block is changed during a period after the garbage collection is performed and until the certain block is used next. For a block in use, when the change of the code rate is determined, the data encoded at the code rate before being changed is programmed until a vacant page disappears.

Figure 9:
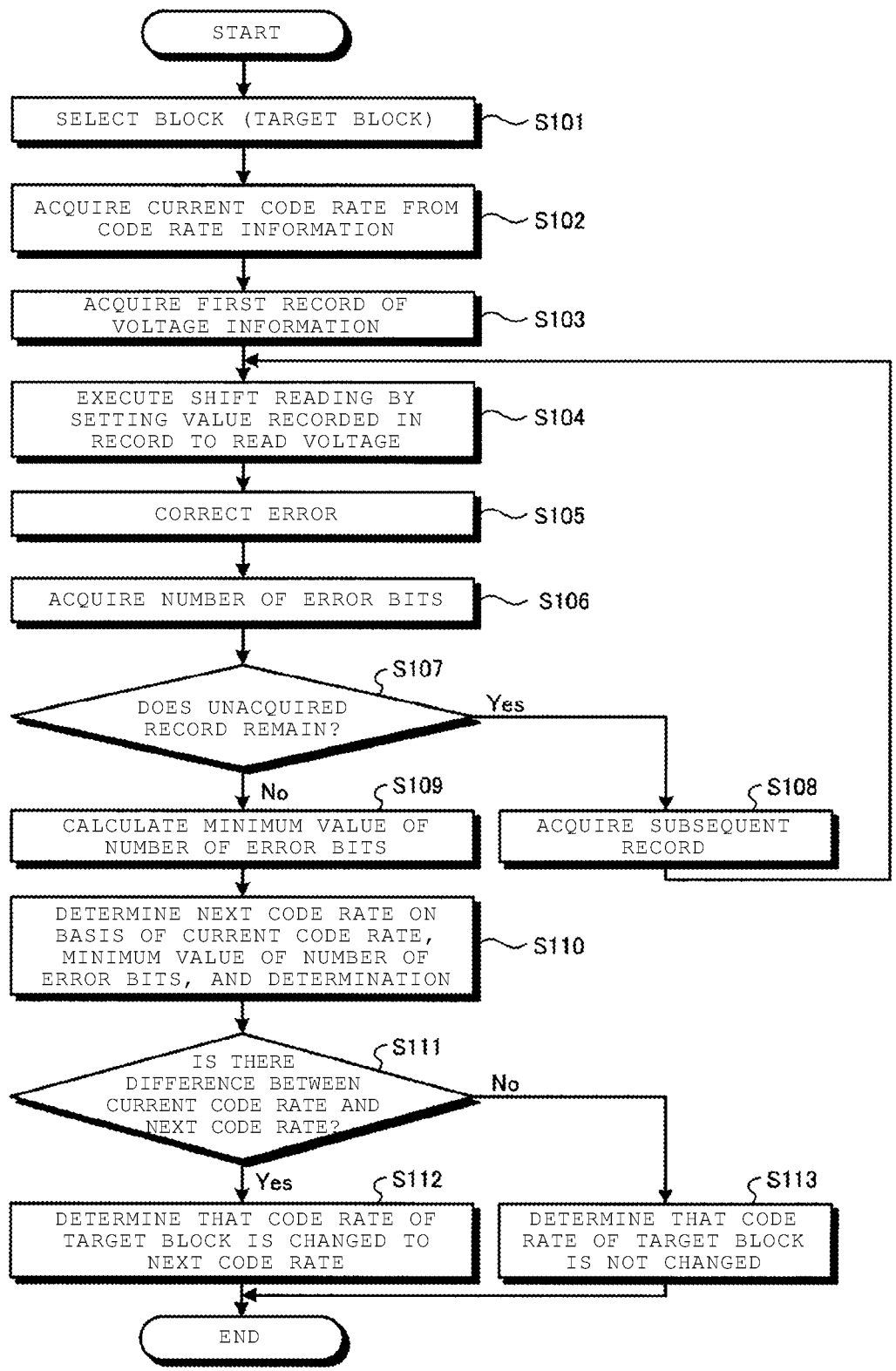
FIG. 9 is a flowchart illustrating an operation of the memory system according to the first embodiment.

FIG. 9 is a flowchart illustrating an operation of the memory system 100 according to the first embodiment. First, the first processing unit 241 selects one block (S101). Any reference may be used as a selection reference. In addition, any timing may be used as a selection timing. In one example, the first processing unit 241 may select each block of the NAND memory 1 in order. In addition, the first processing unit 241 may select the block at a predetermined time interval. The block selected in the processing of S101 will be referred to as a target block in the description of FIG. 9.

Subsequently, the first processing unit 241 acquires a current code rate of the target block from the code rate information 223 (S102). The acquired current code rate is sent to the ECC circuit 25.

Subsequently, the first processing unit 241 acquires the first record of the voltage information 221 (S103). Although the first record of the voltage information 221 is acquired, but any other order may be used as an acquisition order.

The first processing unit 241 executes shift reading with respect to the target block by setting a voltage value recorded in the acquired record as a read voltage (S104). In the processing of S104, any position may be used as a read position. For example, the first processing unit 241 reads data from a page which is determined in advance. The first processing unit 241 may read data from an upper page, may read data from a lower page, or may read data from both of the upper page and the lower page. The first processing unit 241 may read all data items stored in the target block. The first processing unit 241 may determine the read position based on a predetermined reference.

The ECC circuit 25 executes error correction with respect to data output from the NAND memory 1 to the memory controller 2 in S104 by using the current code rate (S105). The first processing unit 241 acquires the number of error bits (S106). When an encoding system (for example, a BCH code) which is capable of outputting the number of error bits is adopted, the first processing unit 241 is capable of acquiring the number of error bits from the ECC circuit 25. In another example, the first processing unit 241 compares data before the error correction with data after the error correction, and thus, is capable of acquiring the number of error bits. The first processing unit 241 stores the number of error bits, for example, in the RAM 22 or the like, in association with a value used as the read voltage.

Subsequently, the first processing unit 241 determines whether or not an unacquired record remains in the voltage information 221 (S107). When the unacquired record remains (S107, Yes), the first processing unit 241 acquires a subsequent record of the voltage information 221 (S108), and executes the processing of S104. When the unacquired record does not remain (S107, No), the first processing unit 241 calculates a minimum value of the number of error bits from the number of error bits stored in each shift reading (S109). The minimum value of the number of error bits which is acquired by the processing of S109 corresponds to the number of error bits when the shift reading is performed by using the optimum voltage value.

Subsequently, the first processing unit 241 determines a next code rate according to the target block based on a current value of the code rate of the target block, the minimum value of the number of error bits, and the determination information 222 (S110).

Subsequently, the first processing unit 241 determines whether or not there is a difference between the current code rate and the next code rate (S111). When there is a difference between the current code rate and the next code rate (S111, Yes), the first processing unit 241 determines that the code rate of the target block is changed to the next code rate (S112), and the operation ends. When the current code rate is identical to the next code rate (S111, No), the first processing unit 241 determines that the code rate of the target block is not changed (S113), and the operation ends. The change of the code rate is executed after the second processing unit 242 executes the garbage collection with respect to the target block and before using the target block. For example, the first processing unit 241 updates the record of the target block in the code rate information 223, and thus, the change of the code rate is executed.

Thus, according to the first embodiment, the memory controller 2 encodes data in a system where the code rate is variable, and stores the encoded data in the block of the NAND memory 1. Then, the memory controller 2 sequentially sets the voltage values different from each other as the read voltage, and executes the shift reading (S103 to S108). Then, the memory controller 2 decreases the code rate according to the result of the shift reading (S109 to S113). According to such a configuration, the memory controller 2 is capable of controlling the code rate in consideration of an error occurrence status when the optimum voltage value is used as the read voltage. Thus, it is possible to prevent the code rate from decreasing more than required. That is, the memory system 100 is capable of efficiently controlling the code rate.

In addition, the memory controller 2 acquires the number of error bits included in the read data in each shift reading by setting the voltage values different from each other (S105 and S106), selects the minimum value of the acquired number of error bits (S109), and determines whether or not the code rate decreases based on the minimum value of the number of error bits (S110 to S113). According to such a configuration, the memory controller 2 is capable of controlling the code rate in consideration of the error occurrence status when the optimum voltage value is used as the read voltage.

Second Embodiment

It is considered that the optimum value of the read voltage is in the vicinity of the threshold voltage in which a distribution of the memory cell is minimized. In a second embodiment, the first processing unit 241 measures the threshold voltage in which the distribution of the memory cell is minimized, and assumes the measured voltage value as the optimum voltage value. In the second embodiment, a method referred to as threshold voltage (Vth) tracking is adopted as a method of measuring the threshold voltage in which the distribution of the memory cell is minimized. According to the Vth tracking, the distribution of the memory cell is measured. Furthermore, any method other than the Vth tracking may be used as the method of measuring the threshold voltage in which the distribution of the memory cell is minimized.

Figure 10:
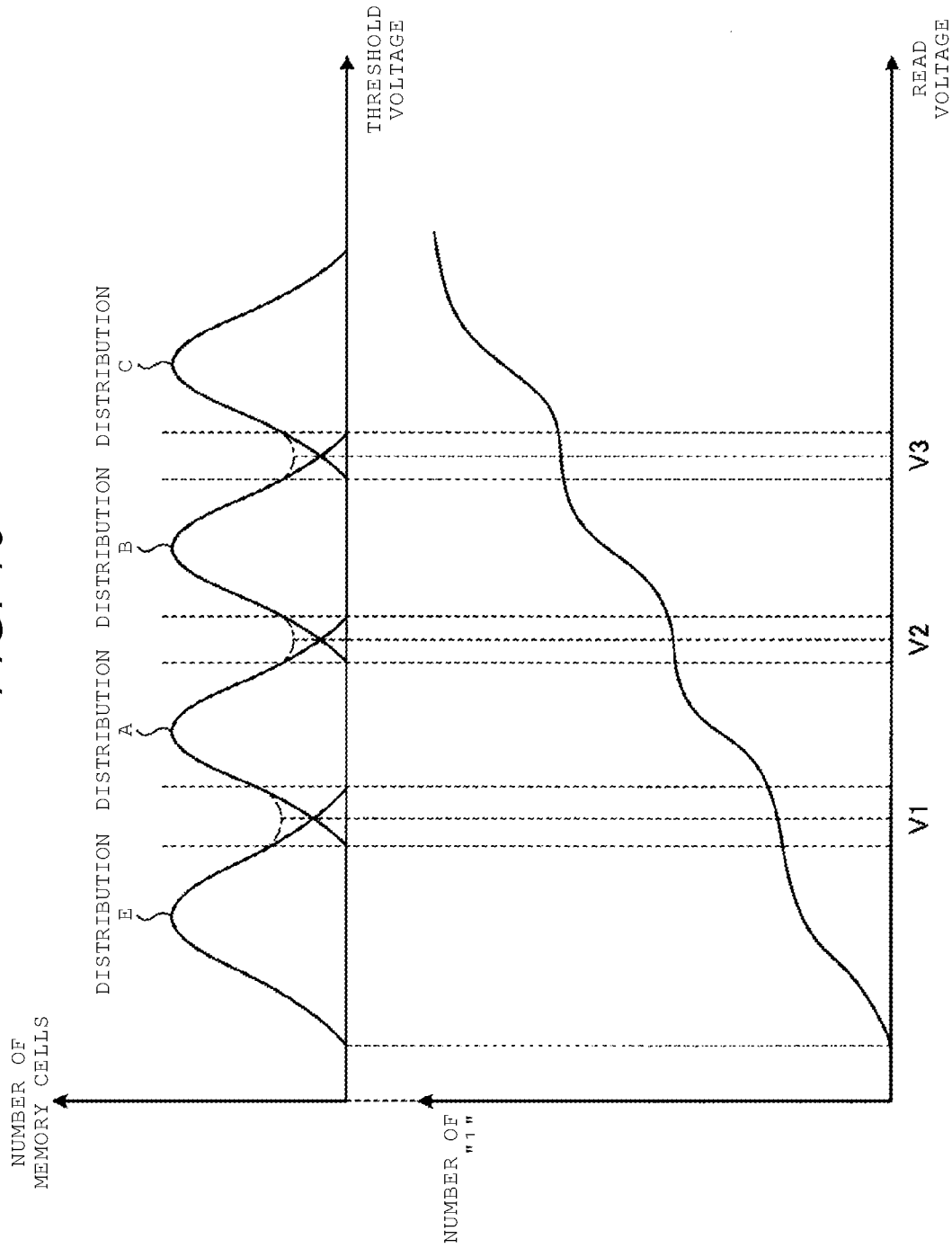
FIG. 10 is a diagram for illustrating Vth tracking.

FIG. 10 is a diagram for illustrating the Vth tracking. A graph on an upper portion of FIG. 10 illustrates an example of the distribution of the memory cell. According to the Vth tracking, when bases overlap each other between distributions in which corresponding data values are different from each other, at a read voltage in a range where a plurality of distributions overlap each other, it is possible to obtain the total number of memory cells belonging to the plurality of distributions which overlap each other. That is, in the example of the graph on the upper portion of FIG. 10, at a read voltage in a range where bases overlap each other between adjacent distributions, it is possible to obtain a shape illustrated by a dashed-dotted line by measurement.

In the Vth tracking, the shift reading is executed in a binary mode while the set value of the read voltage is changed, and a number of "1" or "0" included in the data obtained by each shift reading is counted. The binary mode is a mode in which it is determined that a memory cell where the threshold voltage is less than the read voltage stores a first data value, and it is determined that a memory cell where the threshold voltage is greater than the read voltage stores a second data value different from the first data value. Here, "1" is set as the first data value, "0" is set as the second data value, and the number of "1" is set to be counted, as an example. When the counted number of "1" is plotted with respect to the read voltage, it is possible to obtain a curve illustrated in a lower portion of FIG. 10.

Subsequently, a change rate of the number of "1" is calculated. The change rate of the number of "1" is the amount of change of the number of "1" when the read voltage is changed by a predetermined unit amount. When the change rate is plotted with respect to the read voltage, it is possible to obtain an approximation of the distribution of the memory cell with respect to the threshold voltage (that is, a curve illustrated in the upper portion of FIG. 10).

In the second embodiment, in the Vth tracking, the first processing unit 241 executes the shift reading while increasing the set value of the read voltage by each Vstep, as an example. Then, the first processing unit 241 calculates the amount of change of the number of "1" when the read voltage is increased by each Vstep as the change rate. Then, the first processing unit 241 determines a read voltage in which the amount of change is minimized as the optimum voltage value. In the example in FIG. 10, V1, V2, and V3 correspond to the optimum voltage value.

Furthermore, in the Vth tracking, the first processing unit 241 executes a plurality of times of shift reading while increasing the set value of the read voltage by each Vstep. The change range of the read voltage may cover the entire range in which the threshold voltage of the memory cell is capable of being included, or may cover only a range in the vicinity of a specific voltage value.

In addition, the first processing unit 241 may count the number of "0" instead of the number of "1". In such a case, the first processing unit 241 calculates an absolute value of the amount of change of the number of "0". Thus, it is possible to obtain an approximation of the distribution of the memory cell with respect to the threshold voltage.

Figure 11:
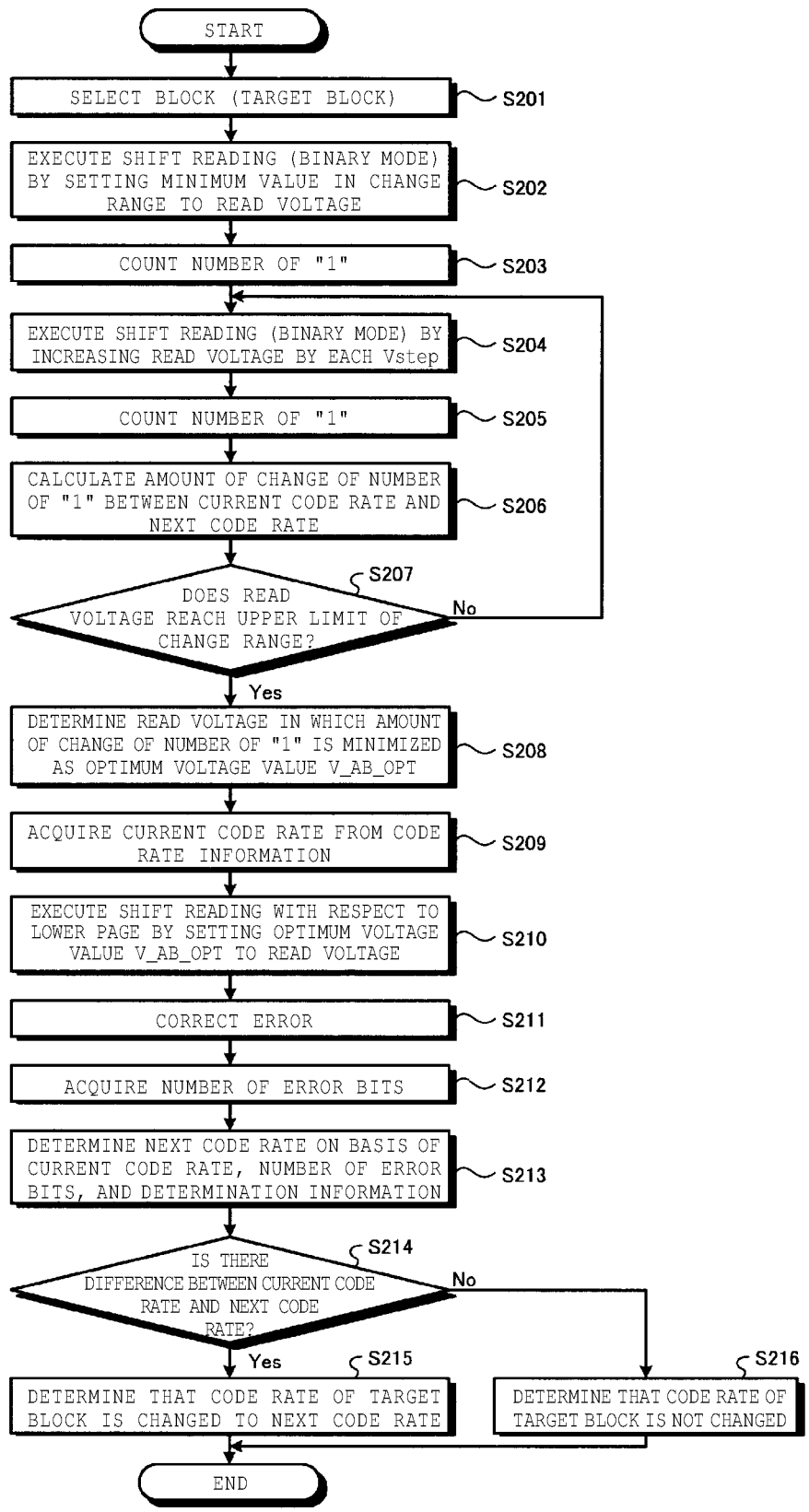
FIG. 11 is a flowchart illustrating an example of an operation of a memory system according to a second embodiment.

FIG. 11 is a flowchart illustrating an example of an operation of the memory system 100 according to the second embodiment. Here, for the sake of simplicity of the description, the first processing unit 241 controls the code rate based on the data stored in the lower page. That is, the first processing unit 241 calculates an optimum voltage value V_AB_OPT with respect to the read voltage V_AB as a part of the control of the code rate.

First, the first processing unit 241 selects one block (S201). As with the first embodiment, any reference may be used as a selection reference. In addition, any timing may be used as a selection timing. The block selected in the processing of S201 will be referred to as a target block in the description of FIG. 11.

Subsequently, the first processing unit 241 starts the Vth tracking. Specifically, the first processing unit 241, first, executes the shift reading with respect to the target block in the binary mode by using a minimum value in a change range of the voltage value in the Vth tracking as the read voltage (S202). Any position may be used as a read position in the target block. The change range of the voltage value, for example, is a range covering the vicinity of the read voltage V_AB.

After the processing of S202, the first processing unit 241 counts the number of "1" included in the data output from the NAND memory 1 to the memory controller 2 (S203). The first processing unit 241 stores a count value, for example, in the RAM 22 or the like.

Subsequently, the first processing unit 241 executes the shift reading in the binary mode by increasing the set value of the read voltage by each Vstep (S204). The first processing unit 241 counts the number of "1" included in the data output from the NAND memory 1 to the memory controller 2 (S205). Then, the first processing unit 241 subtracts the number of "1" obtained at the time of performing previous shift reading from the number of "1" obtained at the time of performing current shift reading, and thus, calculates the amount of change of the number of "1" (S206). The first processing unit 241 stores the calculated amount of change, for example, in the RAM 22 or the like, in association with the set value used as the read voltage in the current shift reading. Furthermore, the first processing unit 241 may associate the calculated amount of change with the voltage value used as the read voltage in the previous shift reading.

Subsequently, the first processing unit 241 determines whether or not the set value of the read voltage reaches an upper limit of the change range (S207). When the set value of the read voltage does not reach the upper limit of the change range (S207, No), the first processing unit 241 executes the processing of a step S204.

When the set value of the read voltage reaches the upper limit of the change range (S207, Yes), the first processing unit 241 determines the optimum voltage value based on a plurality of amounts of change which are stored (S208). In an example, the first processing unit 241 selects a minimum value from the plurality of amounts of change which are stored, and determines a voltage value associated with the selected minimum value as the optimum voltage value.

Subsequently, the first processing unit 241 acquires a current code rate of the target block from the code rate information 223 (S209). The acquired current code rate is sent to the ECC circuit 25. Then, the first processing unit 241 executes reading of the lower page by using the optimum voltage value V_AB_OPT (S210). The ECC circuit 25 executes the error correction with respect to the data output from the NAND memory 1 to the memory controller 2 by using the current code rate (S211). The first processing unit 241 acquires the number of error bits (S212).

Subsequently, the first processing unit 241 determines a next code rate according to the target block based on the current code rate of the target block, the number of error bits, and the determination information 222 (S213).

Subsequently, the first processing unit 241 determines whether or not there is a difference between the current code rate and the next code rate (S214). When there is a difference between the current code rate and the next code rate (S214, Yes), the first processing unit 241 determines that the code rate of the target block is changed to the next code rate (S215), and the operation ends. When the current code rate is identical to the next code rate (S214, No), the first processing unit 241 determines that the code rate of the target block is not changed (S216), the operation ends.

Furthermore, as described above, an example is described in which the first processing unit 241 controls the code rate based on the data stored in the lower page. The first processing unit 241 is capable of controlling the code rate based on data stored in a different page.

For example, the first processing unit 241 controls the code rate based on data stored in the upper page. In such a case, the first processing unit 241 executes the processing of S202 to the processing of S208 with respect to each of the read voltage V_EA and the read voltage V_BC, and thus, calculates an optimum voltage value V_EA_OPT relevant to the read voltage V_EA and an optimum voltage value V_BC_OPT relevant to the read voltage V_BC. Then, in S210, the first processing unit 241 executes reading of the upper page by using the optimum voltage value V_EA_OPT and the optimum voltage value V_BC_OPT.

In another example, the first processing unit 241 controls the code rate based on both of the data stored in the upper page and the data stored in the lower page. In such a case, the first processing unit 241 executes the processing of S202 to the processing of S208 with respect to each of the read voltage V_EA, the read voltage V_AB, and the read voltage V_BC, and thus, calculates the optimum voltage value V_EA_OPT, the optimum voltage value V_AB_OPT, and the optimum voltage value V_BC_OPT.

Thus, according to the second embodiment, the memory controller 2 sequentially sets the voltage values different from each other as the read voltage, and executes the shift reading whenever the read voltage is changed, and acquires the data at each voltage value (S204). Then, the memory controller 2 estimates the optimum voltage value based on the acquired data (S203, S205, S206, and S208). Here, a voltage value in which the distribution of the memory cell forms a valley corresponds to the optimum voltage value. The memory controller 2 executes reading by setting the optimum voltage value as the read voltage (S210), and acquires the number of error bits included in the read data (S211 and S212). Then, the memory controller 2 determines whether or not the code rate decreases based on the acquired number of error bits (S213 to S216). According to such a configuration, the memory controller 2 is capable of controlling the code rate in consideration of an error occurrence status when the optimum voltage value is used as the read voltage.

Furthermore, as with the first embodiment, even in the second embodiment, the determination information 222 may be configured such that three or more determination threshold values are capable of being acquired with respect to the current code rate. In addition, the determination information 222 may be configured such that one determination threshold value is capable of being acquired with respect to the current code rate. In addition, each of the determination threshold values may be a value obtained by adding a margin to a correcting capability obtained by the current code rate.

Third Embodiment

When the read voltage is used in which the distribution of the memory cell is minimized, the number of error bits decreases as the minimum value of the distribution decreases. In addition, a change in the number of error bits with respect to a change with time (a shift) in the distribution decreases as a gradient of a distribution in the vicinity of the minimum value becomes smooth. That is, in the distribution, it is considered that when the minimum value decreases, and the gradient in the vicinity of the minimum value becomes smooth, it is possible to prevent the number of error bits and the amount of change with time of the number of error bits.

In a third embodiment, the first processing unit 241 counts the number of memory cells having a threshold voltage in a predetermined range including the voltage value of the read voltage in which the distribution of the memory cell is minimized (the optimum voltage value) as an amount corresponding to both of the minimum value and the gradient in the vicinity of the minimum value.

Figure 12:
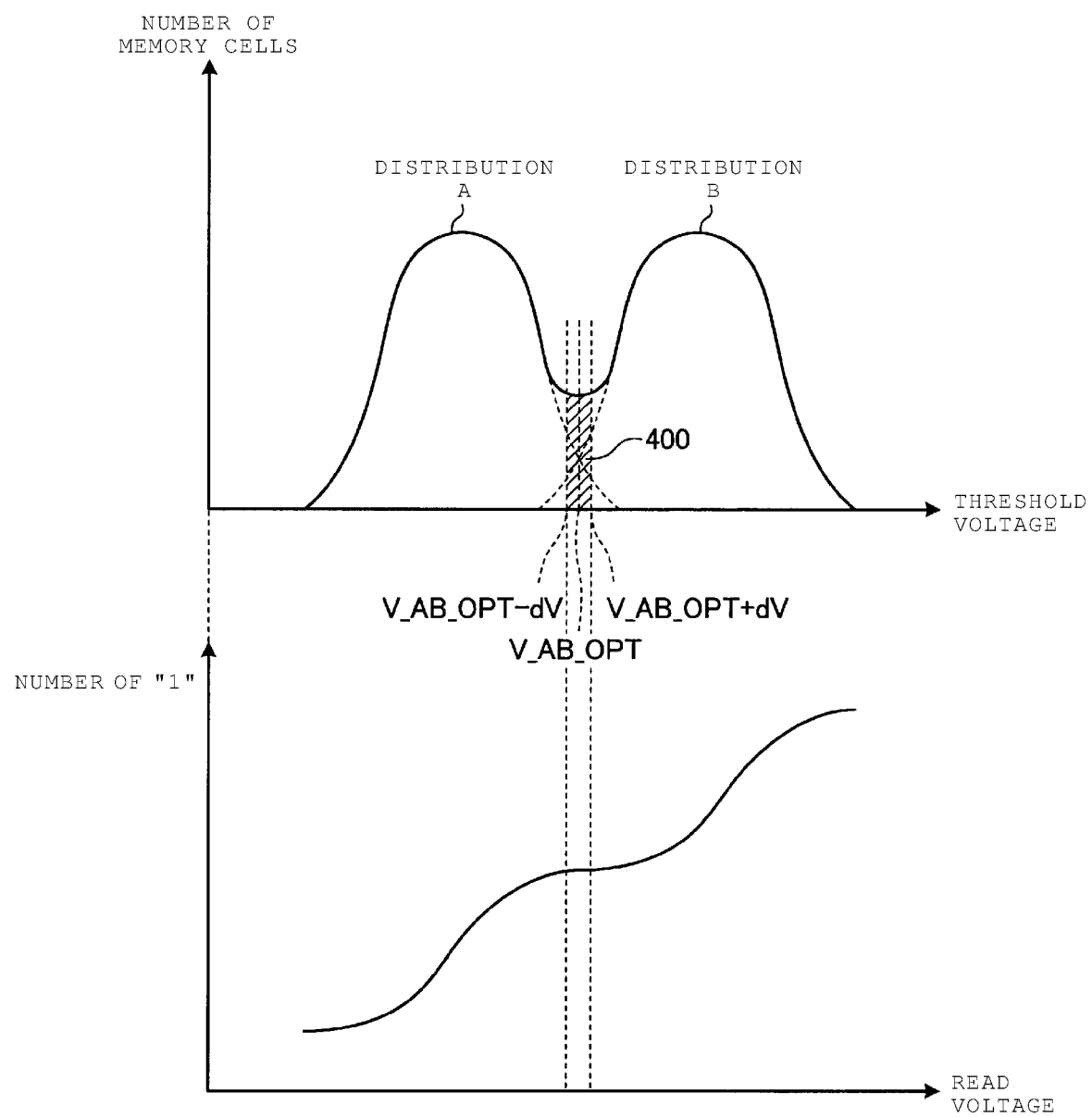
FIG. 12 is a diagram for illustrating a memory cell of a third embodiment which is a counting target.

FIG. 12 is a diagram for illustrating a distribution of the number of memory cells which are counting targets. FIG. 12 illustrates a distribution A and a distribution B as an example. In addition, in the example of FIG. 12, the number of memory cells having a threshold voltage in a range of 2×dV_centered on a voltage value in which the total amount of the distribution A and the distribution B is minimized (the optimum voltage value V_AB_OPT relevant to the read voltage V_AB) (corresponding to an area of a shaded portion 400 in FIG. 12) is the counting target. The number of memory cells having a threshold voltage in the range of 1×dV_centered on V_AB_OPT is capable of being obtained by calculating a difference in the number of "0" or the number of "1" included in two data items read at the time of performing the shift reading in the binary mode by using each of V_AB_OPT+dV_and V_AB_OPT−dV_as the read voltage. Furthermore, any method may be used as a setting method of the range. Hereinafter, the memory cell which is the counting target will be referred to as a target memory cell.

The first processing unit 241 compares the number of target memory cells with the determination threshold value. When the number of target memory cells is greater than the determination threshold value, the first processing unit 241 determines that the code rate decreases. In addition, when the number of target memory cells is less than the determination threshold value, the first processing unit 241 determines that the code rate is not changed. When the number of target memory cells is identical to the determination threshold value, it is determined that the code rate decreases or the code rate is not changed.

Furthermore, as with the first embodiment and the second embodiment, in the third embodiment, a plurality of determination threshold values are set with respect to the current code rate. In addition, each of the determination threshold value increases as the current code rate decreases. Here, the determination information 222 is set to be used. Here, a determination threshold value to be recorded in a cell of the determination information 222 is a threshold value according to the number of target memory cells.

Furthermore, as with the first embodiment and the second embodiment, even in the third embodiment, the determination information 222 may be configured such that three or more determination threshold values are capable of being acquired with respect to the current code rate. In addition, the determination information 222 may be configured such that one determination threshold value is capable of being acquired with respect to the current code rate. In addition, each of the determination threshold values may be a value obtained by adding a margin to a correcting capability obtained by the current code rate.

In addition, the first processing unit 241 is capable of counting the number of target memory cells with respect to a part or all of the read voltages V_EA to V_BC. The first processing unit 241 may count the number of target memory cells with respect to a plurality of read voltages of the read voltages V_EA to V_BC, and may determine that the code rate decreases based on a value based on each of the obtained count values (for example, an average value, a maximum value, or a total value) and the determination threshold value. Here, the first processing unit 241 counts the number of target memory cells with respect to the read voltage V_AB, and determines that the code rate decreases based on the count value, as an example.

In addition, in the third embodiment, the first processing unit 241 estimates the voltage value in which the distribution of the memory cell is minimized (that is, the optimum voltage value) by the same method as that in the second embodiment (that is, the Vth tracking). Any other method may be used as a calculation method of the optimum voltage value.

In addition, as with the first embodiment, in the third embodiment, it is described that the first processing unit 241 determines the next code rate based on the determination information 222. Here, the determination threshold value according to the number of target memory cells is recorded in advance in the determination information 222, instead of the determination threshold value according to the number of error bits.

In addition, as with the first embodiment, the code rate is capable of being changed at an arbitrary timing.

Figure 13:
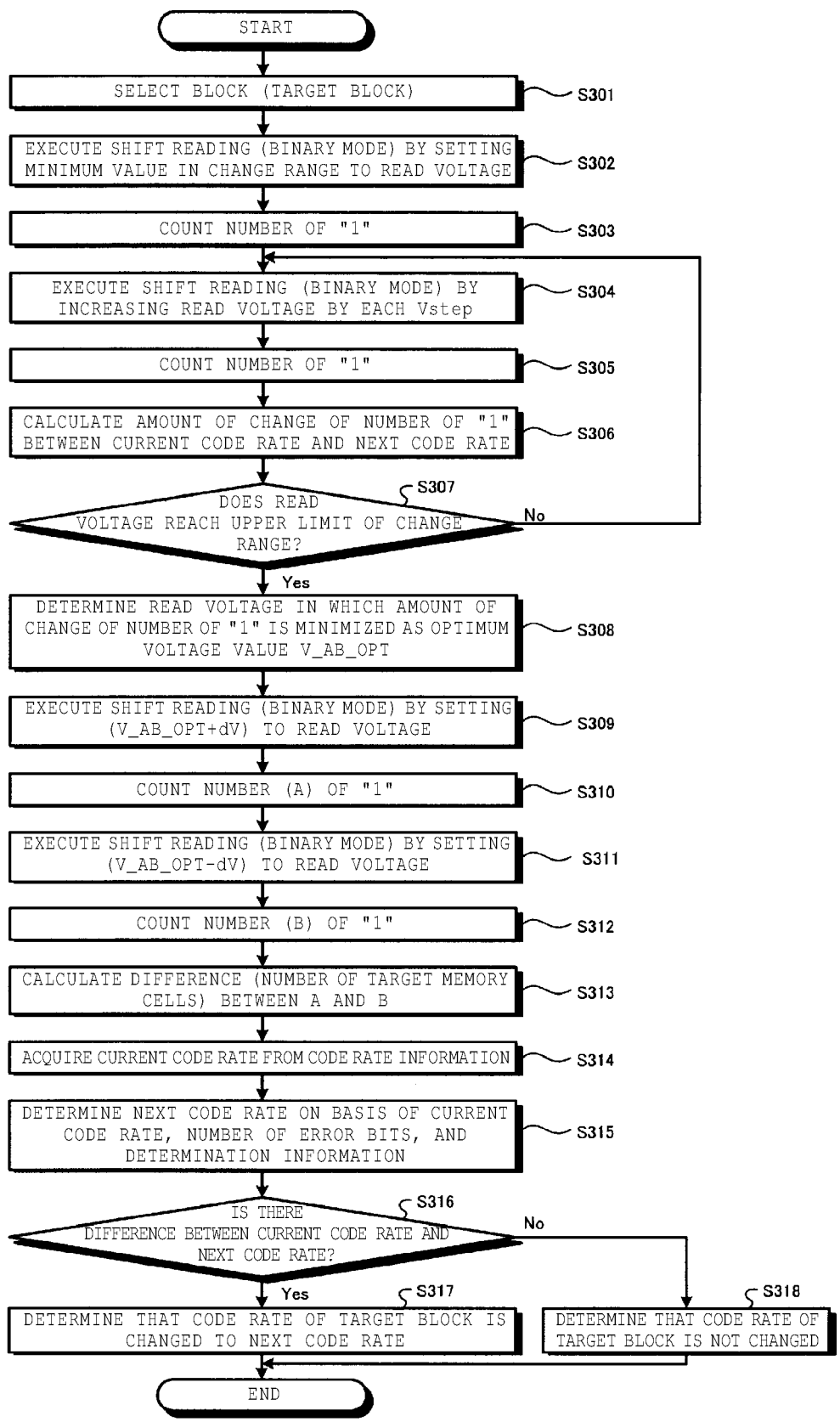
FIG. 13 is a flowchart illustrating an operation of a memory system according to the third embodiment.

FIG. 13 is a flowchart illustrating an operation of the memory system 100 according to the third embodiment. In S301 to S308, the first processing unit 241 executes the same processing as that of S201 to S208 in FIG. 11, and thus, estimates the optimum voltage value V_AB_OPT.

Subsequently, the first processing unit 241 executes the shift reading in the binary mode by using (V_AB_OPT+dV) as the read voltage (S309). Furthermore, (V_AB_OPT+dV) corresponds to an upper limit value of the range. The first processing unit 241 counts the number of "1" included in the data output from the NAND memory 1 to the memory controller 2, and sets the value to A (S310). The first processing unit 241 stores the count value, for example, in the RAM 22 or the like.

Subsequently, the first processing unit 241 executes the shift reading in the binary mode by using (V_AB_OPT−dV) as the read voltage (S311). Furthermore, (V_AB_OPT−dV) corresponds to a lower limit value of the range. The first processing unit 241 counts the number of "1" included in the data output from the NAND memory 1 to the memory controller 2, and sets the value as B (S312). Then, the first processing unit 241 calculates a difference |A−B| between a count value A and a count value B (S313). A value obtained by the processing of S313 corresponds to the number of target memory cells.

Subsequently, the first processing unit 241 acquires the current code rate of the target block from the code rate information 223 (S314). Then, the first processing unit 241 determines the next code rate according to the target block based on the current code rate of the target block, the number of target memory cells, and the determination information 222 (S315).

Subsequently, the first processing unit 241 determines whether or not there is a difference between the current code rate and the next code rate (S316). When there is a difference between the current code rate and the next code rate (S316, Yes), the first processing unit 241 determines that the code rate of the target block is changed to the next code rate (S317), and the operation ends. When the current code rate is identical to the next code rate (S316, No), the first processing unit 241 determines that the code rate of the target block is not changed (S318), and the operation ends.

As described above, an example is described in which the first processing unit 241 uses the read voltage V_AB for controlling the code rate. The first processing unit 241 may use an arbitrary read voltage for controlling the code rate.

In addition, the determination information 222 which is different at each read voltage is prepared, and the first processing unit 241 may use the determination information 222 corresponding to the read voltage used for controlling the code rate. In a case of the lower page, a bit of which a threshold voltage is changed to be greater than the read voltage V_AB is detected as an error. In contrast, in a case of the upper page, both of a bit of which a threshold voltage is changed to be greater than the read voltage V_EA and a bit of which a threshold voltage is changed to be greater than the read voltage V_BC are detected as an error. Therefore, an influence of a change in the threshold voltage on the RBER may be more considerable on the upper page than on the lower page. In consideration of this, for example, a determination threshold value is set in the determination information 222 corresponding to the read voltage V_EA and the read voltage V_BC based on a strict standard, compared to the determination information 222 corresponding to the read voltage V_AB. That is, each of the determination threshold values recorded in the determination information 222 corresponding to the read voltage V_EA and the read voltage V_BC is less than the determination information 222 corresponding to the read voltage V_AB. Furthermore, any other magnitude relationship may be used as a magnitude relationship between the determination threshold value at each of the read voltages.

Thus, according to the third embodiment, the memory controller 2 counts the number of memory cells having a threshold voltage in the range including the optimum voltage value (S309 to S313), and determines whether or not the code rate decreases based on the count value (S315 to S318). According to such a configuration, it is possible to control the code rate in consideration of both of the number of error bits when the optimum voltage value is used as the read voltage, and the amount of increase in the error bit according to a change with time in the distribution, and thus, it is possible to prevent the code rate from decreasing more than required.

Furthermore, the memory controller 2 executes the shift reading by setting the upper limit value of the range to the read voltage (S309), and executes the shift reading by setting the lower limit value of the range to the read voltage (S311). Then, the memory controller 2 counts the number of memory cells having a threshold voltage in the range based on the data obtained by each shift reading (S310, S312, and S313). Any other method may be used as an acquisition method of the number of target memory cells. For example, the lower limit value of the range may be set first, and the upper limit value of the range may be set later.

Fourth Embodiment

In the first embodiment to the third embodiment, it is described that the determination of the change in the code rate is capable of being executed at an arbitrary timing. In a fourth embodiment, an example is described in which conditions are set in an execution timing of the determination of the change in the code rate. As described above, a value of data is changed according to an elapsed time after the data is programmed. Here, conditions relevant to the elapsed time after the data is programmed are set. By setting the conditions relevant to the elapsed time after the data is programmed, it is possible to more accurately change the code rate according to the exhaustion of the memory cell.

Specifically, the first processing unit 241 performs the determination of the change in the code rate after a set time is elapsed after the data is programmed. After the data sent from the host device 200 is programmed, the first processing unit 241 may execute the determination of the change in the code rate by using the data. Here, in order to reduce interference in response performance, the first processing unit 241 selects a block of a determination target (in the description of the fourth embodiment, a target block) from the free block. Then, the first processing unit 241 executes erasing and programming of data with respect to the target block, and after that, executes the determination of the change in the code rate by using the data. The first processing unit 241 is capable of executing the processing from selecting the target block to determining the change in the code rate at an arbitrary timing. The first processing unit 241, for example, is capable of executing the processing from selecting the target block to determining the change in the code rate while the access request from the host device 200 is not processed.

In addition, the first processing unit 241 selects the target block according to the number of execution times of the P/E cycle. The number of execution times of the P/E cycle, for example, is recorded in each block, as the number of erasing times. The first processing unit 241 selects a free block in which the number of erasing times reaches a predetermined number as the target block. Furthermore, for example, when erasing unit is not a block such as a case where erasing is executed in each of a plurality of blocks in a collective manner, any block other than the block may be used as unit of the change in the code rate. The plurality of blocks for which erasing is executed in a collective manner may be selected as the target block in a collective manner. In the fourth embodiment, the first processing unit 241 selects each of the blocks as the target block whenever the number of erasing times reaches 1,000 times.

Figure 14:
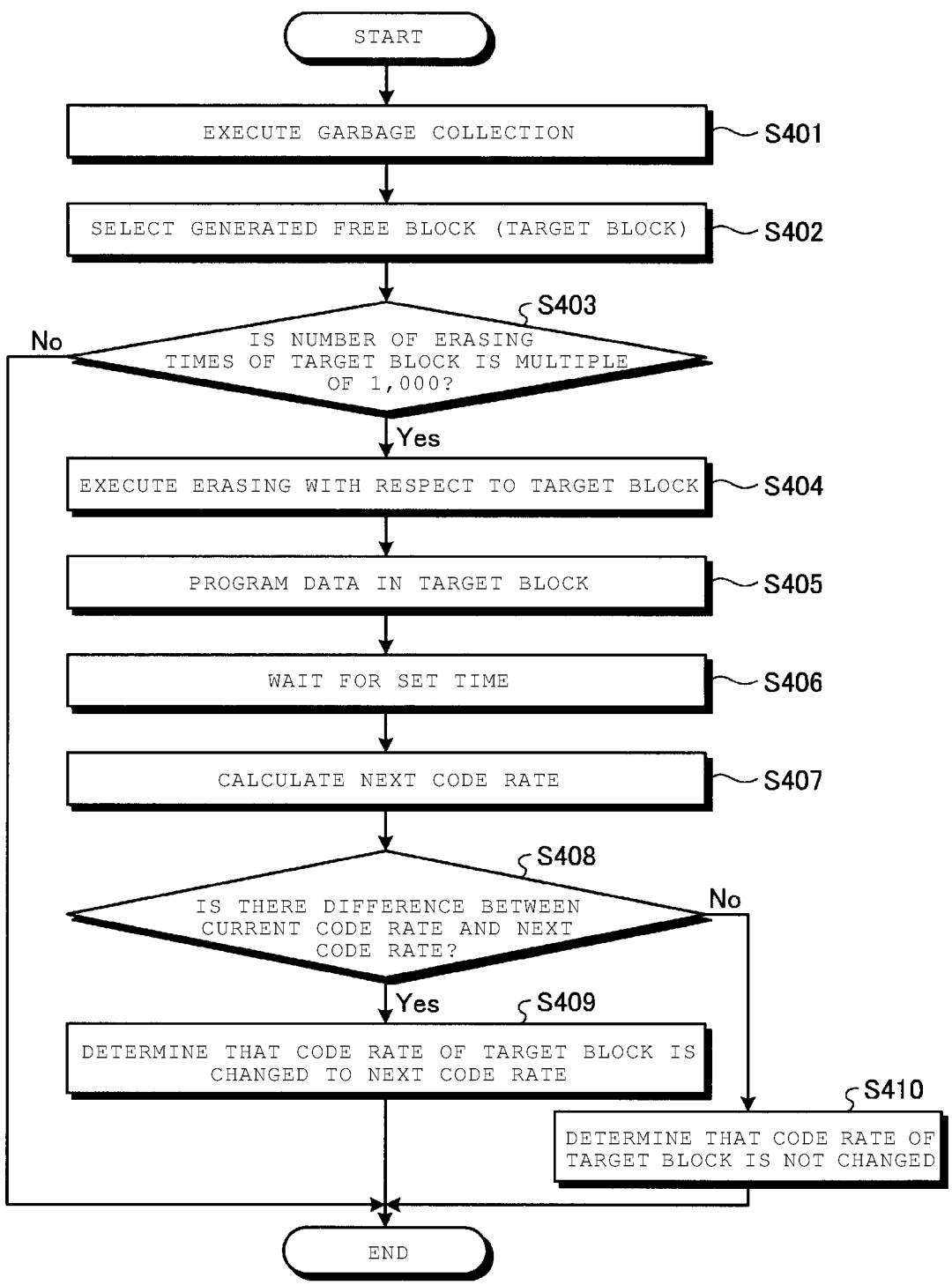
FIG. 14 is a flowchart illustrating an operation of a memory system according to a fourth embodiment.

FIG. 14 is a diagram illustrating a flowchart illustrating an operation of the memory system 100 according to the fourth embodiment. First, the second processing unit 242 executes the garbage collection (S401). Any timing may be used as an execution timing of the garbage collection. Data (at least valid data) is moved by the garbage collection. The second processing unit 242 manages a block of a movement source of the data as the free block. For example, the second processing unit 242 registers the block of the movement source of the data in a free block pool.

Subsequently, the first processing unit 241 selects the block (the target block) which is a free block by the garbage collection (S402). Then, the first processing unit 241 determines whether or not the number of erasing times with respect to the target block is a multiple of 1,000 (S403). When the number of erasing times with respect to the target block is not a multiple of 1,000 (S403, No), the operation ends.

When the number of erasing times with respect to the target block is a multiple of 1,000 (S403, Yes), the first processing unit 241 executes erasing with respect to the target block (S404), and programs the data in the target block (S405). In the processing of S405, any data may be used as the data to be programmed. Arbitrary data is capable of being programmed. The data is programmed after being encoded by the ECC circuit 25. S404 is skipped when the target block is erased in advance.

After the processing of S405, the first processing unit 241 waits until a set time is elapsed (S406), and calculates a next code rate with respect to the block in which the data is programmed by the processing of S405 (S407). Any method may be used as a calculation method of the next code rate. For example, any one method in the first embodiment to the third embodiment is capable of being adopted as the calculation method of the next code rate. For example, when the first embodiment is applied, the first processing unit 241 executes the processing of S102 to the processing of S110 in FIG. 9, and thus, calculates the next code rate.

Subsequently, the first processing unit 241 determines whether or not there is a difference between the current code rate and the next code rate (S408). When there is a difference between the current code rate and the next code rate (S408, Yes), the first processing unit 241 determines that the code rate of the target block is changed to the next code rate (S409), and the operation ends. When the current code rate is identical to the next code rate (S408, No), the first processing unit 241 determines that the code rate of the target block is not changed (S410), and the operation ends.

Thus, according to the fourth embodiment, the memory controller 2 starts the determination of the change in the code rate as elapsed time after the data is programmed (stored) reaches the set time. Accordingly, it is possible to more accurately change the code rate according to the exhaustion of the memory cell, compared to a case where the conditions relevant to the elapsed time after the data is programmed are not set. Furthermore, the memory controller 2 may start the determination of the change in the code rate immediately after the data is programmed, and even in such a case, it is possible to more accurately change the code rate according to the exhaustion of the memory cell, compared to a case where the conditions relevant to the elapsed time after the data is programmed are not set.

In addition, when the number of erasing times reaches the set number of times, the memory controller 2 programs the data for determining the change in the code rate, and starts the determination of the change in the code rate. Accordingly, it is possible to reduce the number of times of programming the data for determining the change in the code rate, and thus, it is possible to prevent the P/E cycle from increasing in order to determine the change in the code rate.

Fifth Embodiment

According to the first embodiment and the second embodiment, when the optimum voltage value is estimated, and the number of error bits included in the data read by using the estimated optimum voltage value satisfies predetermined conditions, the code rate decreases. According to the third embodiment, when the optimum voltage value is estimated, and the number of memory cells having a threshold voltage in the range including the optimum voltage value satisfies predetermined conditions, the code rate decreases. Any other standard may be used as a standard for determining the change in the code rate.

For example, the first processing unit 241 performs shift reading a plurality of times while applying a value recorded in each record of the voltage information 221 as a sequential read voltage. Then, when the error correction succeeds only in a case a value recorded in a specific record of the voltage information 221 is applied as the read voltage, the first processing unit 241 determines that the code rate decreases.

Figure 15:
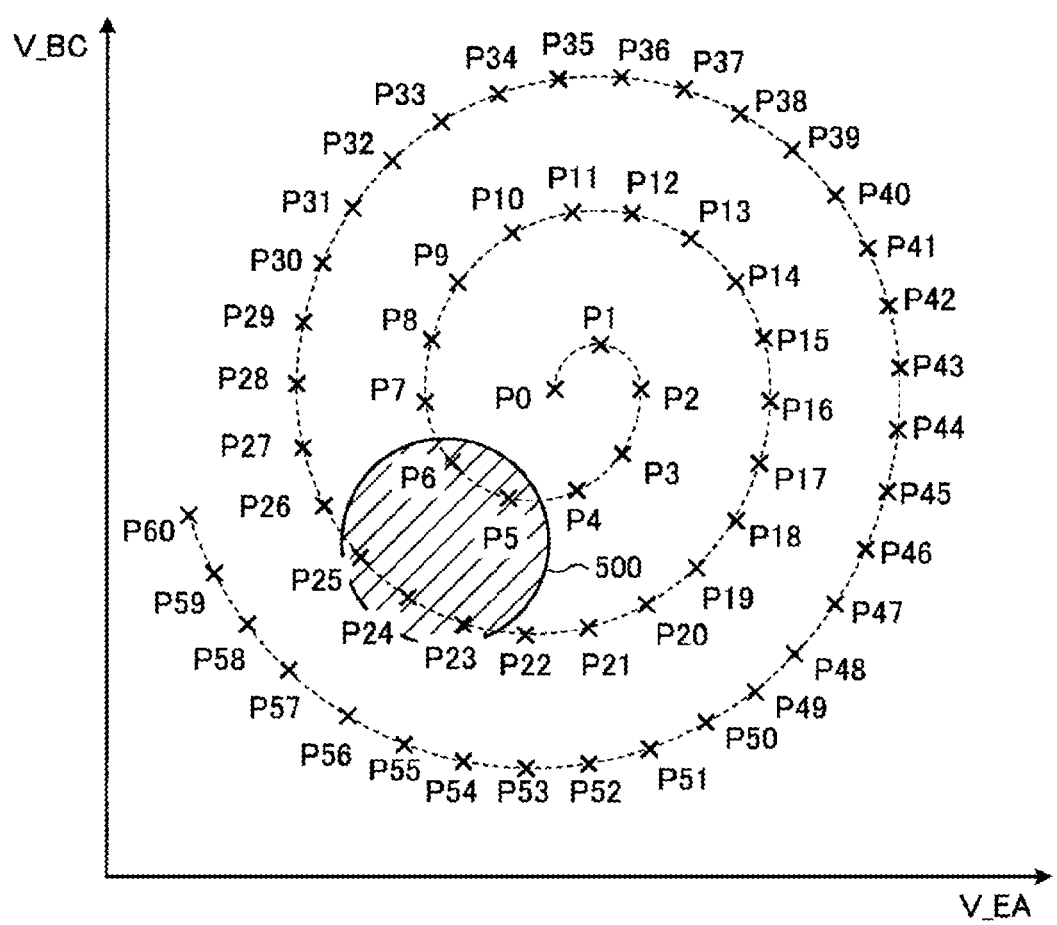
FIG. 15 is a diagram illustrating a graph in which each voltage value is plotted on plane coordinates including $V\_EA$ and $V\_BC$ as a coordinate component.

In another example, values of each of the read voltages are recorded in each of the records of the voltage information 221 to be uniformly dispersed in a coordinate space where the respective read voltages are set to coordinate components different from each other. FIG. 15 is a graph in which the values recorded in each of the records are plotted on plane coordinates where V_EA and V_BC are set to coordinate components. Here, for the sake of simplicity of the description, V_AB is omitted. According to an example in FIG. 15, a voltage value of V_EA and a voltage value of V_BC are set such that each point is distributed into the shape of a whorl (a spiral). A point where the error correction succeeds is distributed into a block of region. A region 500 includes the point where the error correction succeeds and does not include a point where the error correction fails. The region 500 decreases as the exhaustion of the memory cell progresses. Thus, when the points are approximately uniformly dispersed, the area of the region 500 has a positive correlative relationship with respect to the number of records in which the error correction succeeds. That is, the number of points where the error correction succeeds decreases as the exhaustion of the memory cell progresses. The first processing unit 241 performs the shift reading while applying the values recorded in each of the records of the voltage information 221 as the sequential read voltage. Then, when the number of records where the error correction succeeds is less than a determination threshold value, the first processing unit 241 determines that the code rate decreases. As with the first embodiment to the third embodiment, a plurality of determination threshold values may be set at each code rate. In addition, the determination threshold value may be changed according to a decrease in the code rate, or may be fixed.

In still another example, the first processing unit 241 uses a distance from approximately the center to the end of the region 500 as an amount corresponding to the size of the region 500 in FIG. 15, instead of the number of records. As with the first embodiment, the first processing unit 241 executes the shift reading at each of the records, and thus, calculates a record where the number of error bits is minimized. A value recorded in the record where the number of error bits is minimized corresponds to a point on approximately the center of the region 500. Then, the first processing unit 241 calculates a distance between a point positioned on the end of the region 500 and a point positioned on approximately the center of the region 500 in the coordinate space. When the distance is less than a determination threshold value, the first processing unit 241 determines that the code rate decreases. As with the first embodiment to the third embodiment, a plurality of determination threshold values may be set at each code rate. In addition, the determination threshold value may be changed according to a decrease in the code rate, or may be fixed.

The point positioned on the end of the region 500 is capable of being specified by an arbitrary method. For example, the first processing unit 241 sets the read voltage in the order of points connected by a dotted line by using each value indicated by a point P0 as an initial value of the read voltage. That is, each value of the read voltage is recorded in the voltage information 221 in the order of the point P0, a point P1, and a point P2. In the example in FIG. 15, the error correction fails from the point P0 to a point P4, and the error correction succeeds for the first time at a point P5. The first processing unit 241 is capable of specifying the point P5 where the error correction succeeds for the first time as the point positioned on the end of the region 500.

In still another example, the first processing unit 241 executes the shift reading a plurality of times (for example, two times) by applying a reference value to the read voltage. As described above, the reference value, for example, is recorded in advance in the memory chip 11. Alternatively, the first processing unit 241 may transmit the reference value to the memory chip 11 whenever it is required. When no error correction succeeds in the plurality of times of the shift reading using the reference value, the first processing unit 241 determines that the code rate decreases.

In still another example, the first processing unit 241 executes the shift reading a plurality of times by respectively applying the reference value, a value other than the reference value (for example, any one value in a plurality of values recorded in the voltage information 221) to a read voltage/E. Then, when no error correction succeeds in the plurality of times of the shift reading, the first processing unit 241 determines that the code rate decreases.

In still another example, the first processing unit 241 executes the shift reading while applying the value recorded in the voltage information 221 in order from the first record. For example, each value is applied to the read voltage in the order of P1, P2, and P3 by using the point P0 in FIG. 15 as an initial value. When the error correction does not succeed even at a time of applying up to a predetermined record, the first processing unit 241 determines that the code rate decreases.

Thus, various standards are capable of being applied as a standard of the determination of the change in the code rate.

Sixth Embodiment

Figure 16:
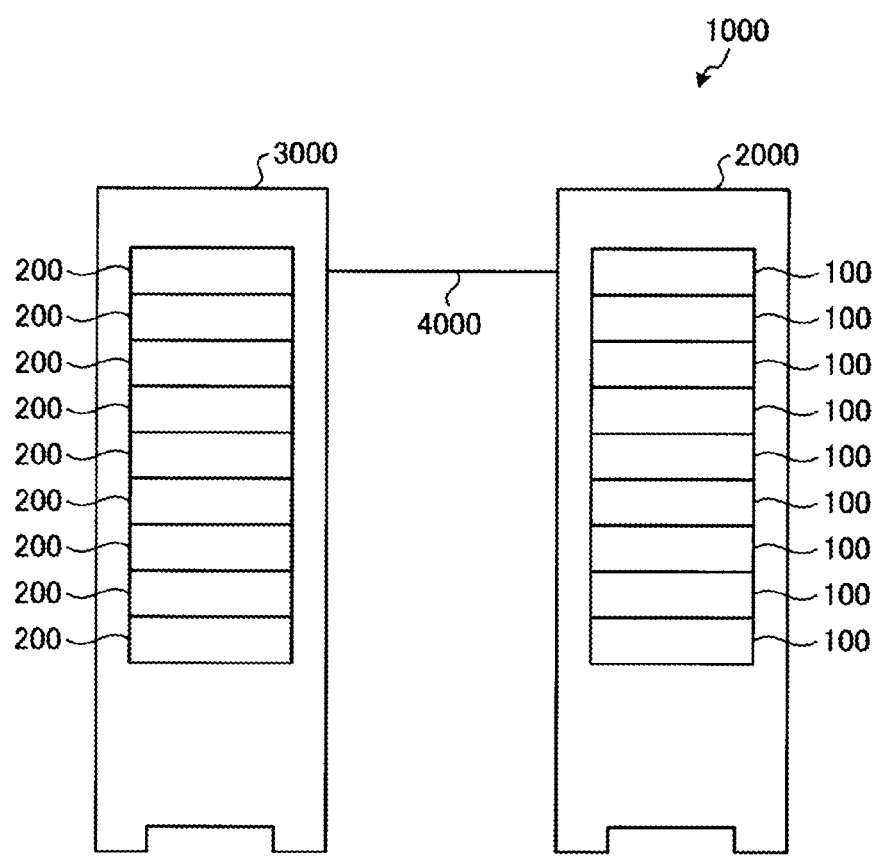
FIG. 16 is a diagram illustrating a mounting example of a memory system.

FIG. 16 is a diagram illustrating a mounting example of the memory system 100. The memory system 100, for example, is mounted on a server system 1000. A disk array 2000 and a rack-mounted server 3000 are connected to the server system 1000 through a communication interface 4000. An arbitrary standard is capable of being adopted as a standard of the communication interface 4000. The rack-mounted server 3000 includes a rack, and one or more host devices 200 are mounted on the rack. Each of the host devices 200 is capable of accessing the disk array 2000 through the communication interface 4000.

In addition, the disk array 2000 includes a rack, and one or more memory systems 100 are mounted on the rack. One or more hard disk units may be mounted on the disk array 2000, in addition to the memory system 100. Each of the memory systems 100 is capable of processing an access request from each of the host devices 200. The configurations of the first embodiment to the fifth embodiment are capable of being adopted in each of the memory systems 100.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a memory including a plurality of areas; and
a controller circuit configured to:
during a write operation to write data to an area among the plurality of areas, encode first data to be written to at a first code rate,
change a code rate with regard to the area from the first code rate to a second code rate that is less than the first code rate when a condition for changing the code rate with regard to the area is satisfied, and
during a next write operation to write data to the area, encode second data to be written to the area at the second code rate, after changing the first code rate to the second code rate, wherein
the condition for the changing the code rate includes:
a number of erase operations processed for the area reaching a predetermined number, and
a certain amount of time elapsing since programming the first data to the area.

2. The memory system according to claim 1, wherein the controller circuit is further configured to:
during a read operation to read the first data from the area before changing the code rate with regard to the area from the first code rate to the second code rate, decode the first data read from the area at the first code rate, and
change the code rate with regard to the area from the first code rate to the second code rate, upon the condition being satisfied and the number of error bits during the read operation of the first data being above a first threshold number.

3. The memory system according to claim 2, wherein the controller circuit is further configured to:
change the code rate with regard to the area from the first code rate to a third code rate that is less than the second code rate, upon the condition being satisfied and the number of error bits during the read operation of the first data being above a second threshold number that is greater than the first threshold number.

4. The memory system according to claim 3, wherein the controller circuit is further configured to:
invalidate the area upon determining that the number of error bits during the read operation is above a third threshold number that is greater than the second threshold number.

5. The memory system according to claim 2, wherein the controller circuit is further configured to:
perform a threshold voltage tracking operation to determine the read voltage for the read operation.

6. The memory system according to claim 1, wherein
the area comprises a plurality of memory cells, and
the controller circuit is further configured to:
process a read operation to read the first data from the area before changing the code rate with regard to the area from the first code rate to the second code rate, and
change the code rate from the first code rate to the second code rate, upon the condition being satisfied and the number of memory cells having a threshold voltage within a voltage range that includes an optimum read voltage within overlapped threshold voltage distributions being above a first threshold number.

7. The memory system according to claim 6, wherein the controller circuit is further configured to:
change the code rate with regard to the area from the first code rate to a third code rate that is less than the second code rate, upon the condition being satisfied and the number of memory cells being above a second threshold number that is greater than the first threshold number.

8. The memory system according to claim 7, wherein the controller circuit is further configured to:
   invalidate the area upon determining that the number of memory cells during the read operation is above a third threshold number that is greater than the second threshold number.

9. The memory system according to claim 6, wherein the controller circuit is further configured to:
   perform a threshold voltage tracking operation to determine the optimum read voltage for the read operation.

10. A method of controlling a memory system including a memory having a plurality of areas, the method comprising:
    during a write operation to write data to an area among a plurality of areas, encoding first data to be written to at a first code rate;
    changing a code rate with regard to the area from the first code rate to a second code rate that is less than the first code rate when a condition for changing the code rate with regard to the area is satisfied; and
    during a next write operation to write data to the area, encoding second data to be written to the area at the second code rate, after changing the first code rate to the second code rate, wherein
    the condition for the changing the code rate includes:
    a number of erase operations processed for the area reaching a predetermined number, and
    a certain amount of time elapsing since programming the first data to the area.

11. The method according to claim 10, further comprising:
    during a read operation to read the first data from the area before changing the code rate with regard to the area from the first code rate to the second code rate, decoding the first data read from the area at the first code rate; and
    changing the code rate with regard to the area from the first code rate to the second code rate, upon the condition being satisfied and the number of error bits during the read operation of the first data being above a first threshold number.

12. The method according to claim 11, further comprising:
    changing the code rate with regard to the area from the first code rate to a third code rate that is less than the second code rate, upon the condition being satisfied and the number of error bits during the read operation of the first data being above a second threshold number that is greater than the first threshold number.

13. The method according to claim 12, further comprising:
    invalidating the area upon determining that the number of error bits during the read operation is above a third threshold number that is greater than the second threshold number.

14. The method according to claim 11, further comprising:
    performing a threshold voltage tracking operation to determine the read voltage for the read operation.

15. The method according to claim 10, wherein
    the area comprises a plurality of memory cells, and
    the method further comprises:
    processing a read operation to read the first data from the area before changing the code rate with regard to the area from the first code rate to the second code rate; and
    changing the code rate from the first code rate to the second code rate, upon the condition being satisfied and the number of memory cells having a threshold voltage within a voltage range that includes an optimum read voltage within overlapped threshold voltage distributions being above a first threshold number.

16. The method according to claim 15, further comprising:
    changing the code rate with regard to the area from the first code rate to a third code rate that is less than the second code rate, upon the condition being satisfied and the number of memory cells being above a second threshold number that is greater than the first threshold number.

17. The method according to claim 16, further comprising:
    invalidating the area upon determining that the number of memory cells during the read operation is above a third threshold number that is greater than the second threshold number.

18. The method according to claim 15, further comprising:
    performing a threshold voltage tracking operation to determine the optimum read voltage for the read operation.

* * * * *